United States Patent
Gao et al.

(10) Patent No.: US 11,810,514 B2
(45) Date of Patent: Nov. 7, 2023

(54) DISPLAY PANEL, METHOD FOR DRIVING THE SAME, AND DISPLAY APPARATUS

(71) Applicants: WUHAN TIANMA MICROELECTRONICS CO., LTD., Wuhan (CN); Wuhan Tianma Microelectronics Co., Ltd. Shanghai Branch, Shanghai (CN)

(72) Inventors: Yana Gao, Wuhan (CN); Xingyao Zhou, Wuhan (CN); Yue Li, Wuhan (CN)

(73) Assignees: WUHAN TIANMA MICROELECTRONICS CO., LTD., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 0 days.

(21) Appl. No.: 17/862,749

(22) Filed: Jul. 12, 2022

(65) Prior Publication Data
US 2022/0343853 A1 Oct. 27, 2022

(30) Foreign Application Priority Data
Apr. 21, 2022 (CN) .......................... 202210425316.X

(51) Int. Cl.
*G09G 3/3258* (2016.01)
*H10K 59/121* (2023.01)
*H10K 59/131* (2023.01)

(52) U.S. Cl.
CPC ....... *G09G 3/3258* (2013.01); *H10K 59/1213* (2023.02); *H10K 59/131* (2023.02); *G09G 2300/0426* (2013.01)

(58) Field of Classification Search
CPC .. G09G 3/3258; G09G 3/3233; G09G 3/3291; G09G 3/2092; H10K 59/121; H10K 59/131
See application file for complete search history.

(56) References Cited

U.S. PATENT DOCUMENTS 9,734,759 B2 * 8/2017 Kim ..................... G09G 3/3233
11,211,010 B2 * 12/2021 Yuan .................... G09G 3/3233
(Continued)

FOREIGN PATENT DOCUMENTS

| CN | 113012643 A | 6/2021 |
|---|---|---|
| CN | 113345377 A | 9/2021 |

*Primary Examiner* — Sardis F Azongha
(74) *Attorney, Agent, or Firm* — CHRISTENSEN O'CONNOR JOHNSON KINDNESS PLLC

(57) ABSTRACT

A display panel, a method for driving the same, and a display apparatus are provided. A pixel driving circuit includes a driving transistor, a data writing circuit, and an adjusting circuit. The driving transistor has a gate electrically connected to a first node, and first and second electrodes respectively electrically connected to a second node and a third node. An operating period of the pixel driving circuit comprises a data writing period including first and second adjusting stages and a data writing period between the first and second adjusting stages. A data writing circuit is configured to provide a data signal to the second node during the data writing period. An adjusting circuit is configured to provide a first adjusting signal to the second node or the third node during the first adjusting stage, and to provide a second adjusting signal to the second node during the second adjusting stage.

20 Claims, 24 Drawing Sheets

(56) References Cited

U.S. PATENT DOCUMENTS 11,217,149 B2 * 1/2022 In .................. G09G 3/2092
2021/0327344 A1 * 10/2021 Dong ................ G09G 3/3233

* cited by examiner

DISPLAY PANEL, METHOD FOR DRIVING THE SAME, AND DISPLAY APPARATUS

CROSS-REFERENCE TO RELATED DISCLOSURE

The present application claims priority to Chinese Patent Application No. 202210425316.X, filed on Apr. 21, 2022, the content of which is incorporated herein by reference in its entirety.

TECHNICAL FIELD

The present disclosure relates to the field of display technologies, and, particularly, relates to a display panel, a method for driving a display panel, and a display apparatus.

BACKGROUND

An organic light-emitting diode (OLED) display panel has gradually become a mainstream display technology for mobile phones, TVs, computers and other display images due to their self-light-emitting, fast response, wide color gamut, large viewing angle, and high brightness.

The OLED is a current-driven device. When the OLED emits light, a driving transistor in a pixel driving circuit is controlled to provide a driving current to the OLED element to emit light. The optical effect of the OLED element is closely associated with the device characteristics of the driving transistor. In the related art, it is not possible to fine-tune the device characteristics of the driving transistor at different stages.

SUMMARY

A first aspect of the present disclosure provides a display panel. The display panel includes light-emitting elements and pixel driving circuits. Each of the pixel driving circuits includes a driving transistor, a data writing circuit, and an adjusting circuit. The driving transistor includes a gate electrically connected to a first node, a first electrode electrically connected to a second node, and a second electrode electrically connected to a third node. The third node is electrically connected to one of the light-emitting elements. Each of at least one operating period of each of the pixel driving circuits includes a data writing period. The data writing period includes a first adjusting stage, a second adjusting stage, and a data writing stage between the first adjusting stage and the second adjusting stage. The data writing circuit is configured to provide a data signal to the second node during the data writing stage. The adjusting circuit is configured to provide a first adjusting signal to the second node or the third node during the first adjusting stage, and provide a second adjusting signal to the second node during the second adjusting stage.

A second aspect of the present disclosure provides a method for driving a display panel. The display panel includes light-emitting elements and pixel driving circuits. Each of the pixel driving circuits includes a driving transistor, a data writing circuit, and an adjusting circuit. The driving transistor includes a gate electrically connected to a first node, a first electrode electrically connected to a second node, and a second electrode electrically connected to a third node. Each of at least one operating period of each of the pixel driving circuits includes a data writing period. The data writing period includes a first adjusting stage, a second adjusting stage, and a data writing stage between the first adjusting stage and the second adjusting stage. The method includes: controlling the adjusting circuit to provide a first adjusting signal to the second node or the third node during the first adjusting stage, controlling the data writing circuit to provide a data signal to the second node during the data writing stage, and controlling the adjusting circuit to provide a second adjusting signal to the second node during the second adjusting stage.

A third aspect of the present disclosure provides a display apparatus. The display apparatus includes a display panel. The display panel includes light-emitting elements and pixel driving circuits. Each of the pixel driving circuits includes a driving transistor, a data writing circuit, and an adjusting circuit. The driving transistor includes a gate electrically connected to a first node, a first electrode electrically connected to a second node, and a second electrode electrically connected to a third node. The third node is electrically connected to one of the light-emitting elements. Each of at least one operating period of each of the pixel driving circuits includes a data writing period. The data writing period includes a first adjusting stage, a second adjusting stage, and a data writing stage between the first adjusting stage and the second adjusting stage. The data writing circuit is configured to provide a data signal to the second node during the data writing stage. The adjusting circuit is configured to provide a first adjusting signal to the second node or the third node during the first adjusting stage, and provide a second adjusting signal to the second node during the second adjusting stage.

BRIEF DESCRIPTION OF DRAWINGS

In order to more clearly illustrate technical solutions of embodiments of the present disclosure, the accompanying drawings used in the embodiments are briefly described below. The drawings described below are merely some embodiments of the present disclosure. Based on these drawings, those skilled in the art can obtain other drawings.

DESCRIPTION OF EMBODIMENTS

In order to better understand technical solutions of the present disclosure, the embodiments of the present disclosure are described in detail with reference to the drawings.

It should be clear that the described embodiments are merely some of the embodiments of the present disclosure rather than all embodiments. All other embodiments obtained by those skilled in the art shall fall into the scope of the present disclosure.

The terms used in the embodiments of the present disclosure are merely for the purpose of describing specific embodiment, rather than limiting the present disclosure. The terms "a", "an", "the" and "said" in a singular form in some embodiments of the present disclosure and the attached claims are also intended to include plural forms thereof, unless noted otherwise.

It should be understood that the term "and/or" used in the context of the present disclosure is to describe a correlation relation of related objects, indicating that there can be three relations, e.g., A and/or B can indicate A alone, A and B, and B alone. The symbol "/" in the context generally indicates that the relation between the objects before and after "/" is an "or" relationship.

It should be understood that although the terms 'first', 'second' and 'third' can be used in the present disclosure to describe transistors, these transistors should not be limited to these terms. These terms are used only to distinguish the transistors from each other. For example, without departing from the scope of the embodiments of the present disclosure, a first transistor can also be referred to as a second transistor. Similarly, the second transistor can also be referred to as the first transistor.

Figure 1:
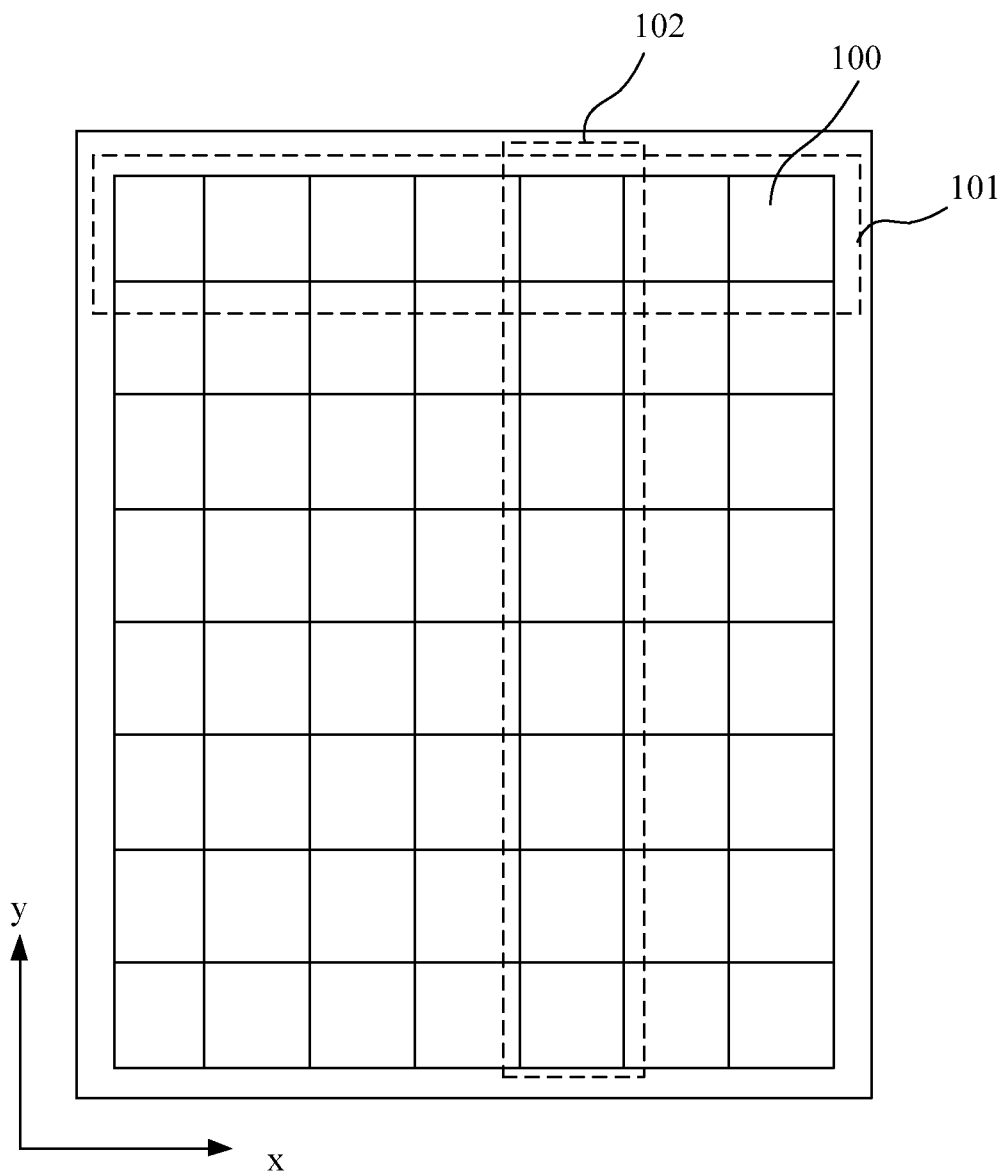
FIG. 1 is a schematic diagram of a display panel according to some embodiments of the present disclosure.

Some embodiments of the present disclosure provide a display panel. The display panel includes multiple sub-pixels. The sub-pixel includes a pixel driving circuit and a light-emitting element that are electrically connected to each other. FIG. 1 is a schematic diagram of a display panel according to some embodiments of the present disclosure. As shown in FIG. 1, the pixel driving circuits 100 can be arranged in an array along a first direction x and a second direction y. The first direction x and the second direction y intersect with each other. Multiple pixel driving circuits 100 arranged along the first direction x form a pixel driving circuit row 101. Multiple pixel driving circuit rows 101 are arranged along the second direction y. Multiple pixel driving circuits 100 arranged along the second direction y form a pixel driving circuit column 102. Multiple pixel driving circuit columns 102 are arranged along the first direction x.

Figure 2:
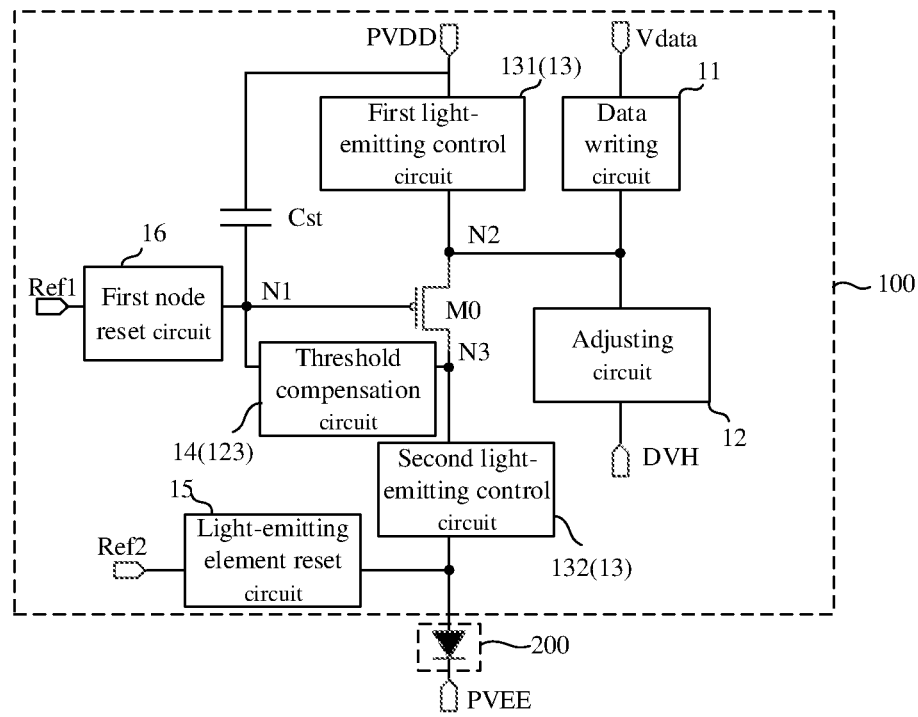
FIG. 2 is a schematic diagram of an equivalent circuit of a sub-pixel according to some embodiments of the present disclosure.
Figure 3:
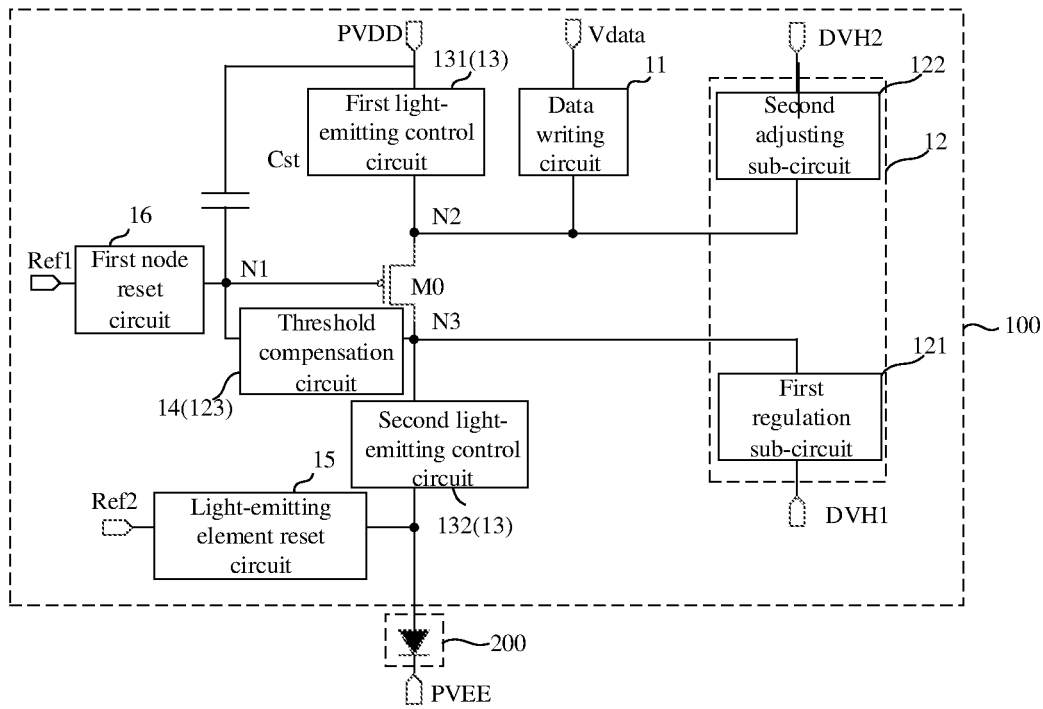
FIG. 3 is a schematic diagram of an equivalent circuit of a sub-pixel according to other embodiments of the present disclosure.

As shown in FIG. 2 and FIG. 3, FIG. 2 and FIG. 3 are respectively schematic diagrams of equivalent circuits of two sub-pixels provided by some embodiments of the present disclosure, and a sub-pixel includes a pixel driving circuit 100 and a light-emitting element 200. The light-emitting element 200 includes any one or more of an organic light-emitting diode (OLED), a quantum dot light-emitting diode (QLED), or a micro light-emitting diode (Mini LED or Micro LED).

As shown in FIG. 2 and FIG. 3, the pixel driving circuit 100 includes a driving transistor M0, a data writing circuit 11, an adjusting circuit 12, and a light-emitting control circuit 13. A gate of the driving transistor M0 is electrically connected to a first node N1, a first electrode of the driving transistor M0 is electrically connected to a second node N2, and a second electrode of the driving transistor M0 is electrically connected to a third node N3. The third node N3 is electrically connected to the light-emitting element 200.

A first terminal of the data writing circuit 11 is electrically connected to a data signal terminal Vdata, and a second terminal of the data writing circuit 11 is electrically connected to the second node N2. The light-emitting control circuit 13 includes a first light-emitting control circuit 131 and a second light-emitting control circuit 132. A first terminal of the first light-emitting control circuit 131 is electrically connected to a first power voltage terminal PVDD, and a second terminal of the first light-emitting control circuit 131 is electrically connected to the second node N2. A first terminal of the second light-emitting control circuit 132 is electrically connected to the third node N3, and a second terminal of the second light-emitting control circuit 132 is electrically connected to a first electrode of the light-emitting element 200. A second electrode of the light-emitting element 200 is electrically connected to a second power voltage terminal PVEE. Exemplarily, a voltage of the first power voltage terminal PVDD is greater than a voltage of the second power voltage terminal PVEE.

In some embodiments, the driving transistor M0 includes a P-type transistor. A driving current of the driving transistor M0 is determined by its gate voltage and source voltage. Based on the above connection, the source of the driving transistor M0 is electrically connected to the first power voltage terminal PVDD, so that the interference of the source voltage of the driving transistor M0 can be reduced, thereby making it easier to control the driving current of the driving transistor M0.

In some embodiments of the present disclosure, an operating period of the pixel driving circuit 100 includes a data writing period, the data writing period includes a first adjusting stage, a data writing stage, a second adjusting stage, and a light-emitting period, the data writing stage is located during the first adjusting stage and the second adjusting stage, and the light-emitting period is located after the second adjusting stage.

When the pixel driving circuit 100 is operating, during a data writing period, as shown in FIG. 2, the control adjusting circuit 12 provides a first adjusting signal DVH1 to the second node N2 during the first adjusting stage. In some embodiments, as shown in FIG. 3, during the first adjusting stage, the control adjusting circuit 12 provides the first adjusting signal DVH1 to the third node N3. In the first adjusting stage, the potential of the second node N2 or the potential of the third node N3 is refreshed, so that the device characteristics of the driving transistor M0 are set to a determined initial state during the first adjusting stage, so as to eliminate the influence of the data signal wrote during the previous frame of the display image on the device characteristics of the driving transistor M0. Then, when entering the data writing stage of the current frame display image, the driving transistor M0 can receive the data voltage provided by the data writing circuit 11 on the basis of the above-determined initial state, so that the pixel driving circuit 100 is enabled to generate the light-emitting current for the current frame image in a subsequent light-emitting period. In some embodiments, the voltage $V_{DVH1}$ of the first adjusting signal DVH1 satisfies: $V_{DVH1} \geq V_{PVDD}$, where $V_{PVDD}$ denotes a voltage provided by the first power voltage terminal PVDD.

During the data writing stage, the data writing circuit 11 is controlled to provide a data signal Vdata to the second node N2.

During the second adjusting stage, the adjusting circuit 22 is controlled to provide a second adjusting signal DVH2 to the second node N2. In some embodiments of the present disclosure, the second adjusting signal DVH2 can be a signal associated with the data signal Vdata, so that the state of the driving transistor M0 during the second adjusting stage tends to be consistent with the characteristics of the driving transistor M0 during the data writing stage t2.

Then, when entering the light-emitting period, the light-emitting control circuit 13 is controlled to be turned on, so that the light-emitting element 200 is turned on.

In the embodiments of the present disclosure, by providing the adjusting circuit 12 in the pixel driving circuit 100, and adding the first adjusting stage and the second adjusting stage in the data writing period of the pixel driving circuit 100, the first adjusting signal DVH1 is provided to the second node N2 or the third node N3 in the pixel driving circuit 100 during the first adjusting stage, and the second adjusting signal DVH2 is provided to the second node N2 during the second adjusting stage, so that the second node N2 and/or the third node N3 can be provided with the signals during different periods, and the driving transistor M0 can be in a target state during different periods when the pixel driving circuit operates. For example, during the first adjusting stage of each frame of the display image, the first adjusting signal is wrote to the second node N2 or the third node N3 in the pixel driving circuit 100 to refresh the potential of the second node N2 or the potential of the third node N3. A voltage of the first adjusting signal can be greater than a voltage of the first power voltage terminal. When the display panel switches different display images, this operation can eliminate the influence of the previous frame of the display image on the display image of the current frame, thereby improving the hysteresis and smear of the image displayed on the display panel. In the second adjusting stage, the embodiments of the present disclosure can write a signal associated with the data signal of the image of current frame to the second node N2 in the pixel driving circuit 100, and the device characteristics of the driving transistor M0 during the second adjusting stage can be kept being consistent with the device characteristics of the driving transistor M0 during the data writing stage. With the above configuration provided by the embodiments of the present disclosure, fine regulation of the device characteristics of the driving transistors can be realized during different operating stages of the pixel driving circuit 100.

Exemplarily, the pixel driving circuit 100 includes multiple operating periods. In one operating period, a data signal can be written to the pixel driving circuit 100 through the data writing circuit 11 once to refresh the display image. During different operating periods, the first adjusting signals DVH1 can be the same. Exemplarily, the second adjusting signal DVH2 can correspond to the data signal Vdata written by the data writing circuit 11 during the current operating period, that is, the second adjusting signal DVH2 can be adjusted according to different display images.

Exemplarily, as shown in FIG. 2 and FIG. 3, the pixel driving circuit 100 also includes a threshold compensation circuit 14, a light-emitting element reset circuit 15, and a first node reset circuit 16. A first terminal of the threshold compensation circuit 14 is electrically connected to the third node N3, and a second terminal of the threshold compensation circuit 14 is electrically connected to the first node N1. A first terminal of the first node reset circuit 16 is electrically connected to the first reset signal terminal Ref1, and a second terminal of the first node reset circuit 16 is electrically connected to the first node N1. A first terminal of the light-emitting element reset circuit 15 is electrically connected to the second reset signal terminal Ref2, and a second terminal of the light-emitting element reset circuit 15 is electrically connected to the first electrode of the light-emitting element 200. Exemplarily, in some embodiments of the present disclosure, $V_{Ref1}=V_{Ref2}<V_{PVEE}$, where $V_{Ref1}$ denotes a voltage of the first reset signal terminal Ref1, $V_{Ref2}$ denotes a voltage of the second reset signal terminal Ref2, and $V_{PVEE}$ denotes a voltage of the second power voltage terminal PVEE.

As shown in FIG. 2 and FIG. 3, the pixel driving circuit 100 can include a storage capacitor Cst. A first terminal of the storage capacitor Cst is electrically connected to the first node N1, and a second terminal of the storage capacitor Cst is electrically connected to a fixed potential terminal, such as the first power voltage terminal PVDD.

The data writing period of the pixel driving circuit 100 can include a first node reset period, a light-emitting element reset period, and a threshold compensation phase. The first node reset circuit 16 is configured to provide a first reset signal to the first node N1 during the first node reset period, so as to clear a signal written by the first node N1 in a previous data writing period T1. The threshold compensation circuit 14 is configured to detect and self-compensate a threshold voltage of the driving transistor M0 during the threshold compensation phase. During the threshold compensation phase, the first node N1 and the third node N3 are electrically connected to each other. When a data signal is written to the second node N2, the driving transistor M0 is turned on, the data signal written by the data signal terminal Vdata to the second node N2 through the data writing circuit 11 and to charge the first node N1 through the driving transistor M0 and the threshold compensation circuit 14 until $V_{N1}=Vdata-|Vth|$, so that the potential of the control electrode of the driving transistor M0 is associated to the threshold voltage Vth of the driving transistor M0, and threshold compensation is completed. The light-emitting element reset circuit 15 is configured to provide a second reset signal to the light-emitting element 200 during the light-emitting element reset period, so as to avoid the undesired light-emitting of the light-emitting element 200 during a non-light-emitting period.

Figure 4:
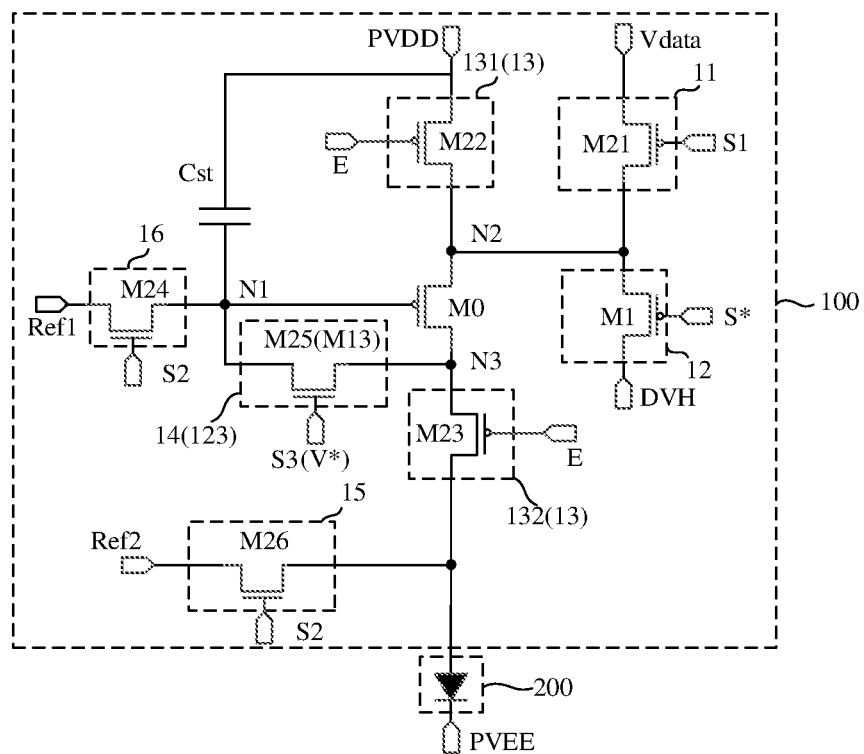
FIG. 4 is a schematic diagram of an equivalent circuit of a sub-pixel according to other embodiments of the present disclosure.

FIG. 4 is a schematic diagram of an equivalent circuit of a sub-pixel according to other embodiments of the present disclosure. Exemplarily, as shown in FIG. 4, a first terminal of the adjusting circuit 12 is electrically connected to the second node N2, and a second terminal of the adjusting circuit 12 is electrically connected to the adjusting signal terminal DVH. The adjusting circuit 12 provides a signal of the adjusting signal terminal DVH to the second node N2 in response to the signal of an adjusting control terminal S*. The adjusting signal terminals DVH are respectively configured to provide a first adjusting signal DVH1 during the first adjusting stage, and to provide a second adjusting signal DVH2 during the second adjusting stage.

Exemplarily, as shown in FIG. 4, in the pixel driving circuit 100, the adjusting circuit 12 includes an adjusting transistor M1. A control electrode of the adjusting transistor M1 is electrically connected to the adjusting control terminal S*, a first electrode of the adjusting transistor M1 is electrically connected to the adjusting signal terminal DVH, and a second electrode of the adjusting transistor M1 is electrically connected to the second node N2. During both the first adjusting stage and the second adjusting stage, the adjusting control terminal S* provides an enable signal, and the adjusting transistor M1 is turned on under the enable signal and writes the first adjusting signal DVH1 and the second adjusting signal DVH2 that are provided by the adjusting signal terminal DVH to the second node N2. Exemplarily, the adjusting transistor M1 can be a P-type transistor, and in this case, an enable level of the adjusting control terminal S* is a low level. In some embodiments, the adjusting transistor M1 can also be an N-type transistor, and in this case, an enable level of the adjusting control terminal S* is a high level. In FIG. 4, the adjusting transistor M1 is a P-type transistor for illustration.

Referring to FIG. 4, the data writing circuit 11 includes a first transistor M21. A control electrode of the first transistor M21 is electrically connected to a first scan control terminal S1, a first electrode of the first transistor M21 is electrically connected to the data signal terminal Vdata, and a second electrode of the first transistor M21 is electrically connected to the second node N2.

The light-emitting control circuit 13 includes a second transistor M22 and a third transistor M23. A control electrode of the second transistor M22 and a control electrode of the third transistor M23 are both electrically connected to the light-emitting control signal terminal E. A first electrode of the second transistor M22 is electrically connected to the first power voltage terminal PVDD, and a second electrode of the second transistor M22 is electrically connected to the second node N2. A first electrode of the third transistor M23 is electrically connected to the third node N3, and a second electrode of the third transistor M23 is electrically connected to the first electrode of the light-emitting element 200. During the light-emitting period, the light-emitting control signal terminal E transmits an enable level, so that the second transistor M22 and the third transistor M23 are turned on, and $V_{N2}=V_{PVDD}$ In this case, the data writing circuit 11 is controlled to be disconnected from the second node N2, and the control adjusting circuit 12 is controlled to be disconnected from the second node N2 or the third node N3.

In some embodiments, as shown in FIG. 4, the first node reset circuit 16 includes a fourth transistor M24. A control electrode of the fourth transistor M24 is electrically connected to a second scan control terminal S2, a first electrode of the fourth transistor M24 is electrically connected to the first reset signal terminal Ref1, and a second electrode of the fourth transistor M24 is electrically connected to the first node N1. The threshold compensation circuit 14 includes a fifth transistor M25. A control electrode of the fifth transistor M25 is electrically connected to a third scan control terminal S3, a first electrode of the fifth transistor M25 is electrically connected to the third node N3, and a second electrode of the fifth transistor M25 is electrically connected to the first node N1. During the threshold compensation phase, the first node N1 and the third node N3 are electrically connected to each other, and the data signal written by the data signal terminal Vdata to the second node N2 through the data writing circuit 11 charges the first node N1 through the driving transistor M0 and the fifth transistor M25 until $V_{N1}=Vdata-|Vth|$, so that the potential of the control electrode of the driving transistor M0 is associated with the threshold voltage of the driving transistor M0, and the threshold compensation is completed.

The light-emitting element reset circuit 15 includes a sixth transistor M26. A first electrode of the sixth transistor M26 is electrically connected to a second reset signal terminal Ref2, and a second electrode of the sixth transistor M26 is electrically connected to the first electrode of the light-emitting element 200. Exemplarily, in some embodiments of the present disclosure, the sixth transistor M26 and the fourth transistor M24 can be of the same type. FIG. 4 schematically shows that the sixth transistor M26 and the fourth transistor M24 are N-type transistors. In this case, in some embodiments of the present disclosure, a control electrode of the sixth transistor M26 can be also electrically connected to the second scan control terminal S2, that is, the first node N1 and the light-emitting element 200 can be reset simultaneously to compress the operating period of the pixel driving circuit. In some embodiments of the present disclosure, the reset operation is performed on the light-emitting element 200 during the non-light-emitting period such as the first adjusting stage, the second adjusting stage, and the data writing stage, etc.

In some embodiments, the fourth transistor M24 and the fifth transistor M25 that are electrically connected to the first node N1 include oxide semiconductor transistors, so that the fourth transistor M24 and the fifth transistor M25 have a relatively small off-state leakage current, thereby improving the potential stability of the first node N1, the brightness stability of the light-emitting element 200, and the flickering phenomenon of the light-emitting element 200.

Figure 5:
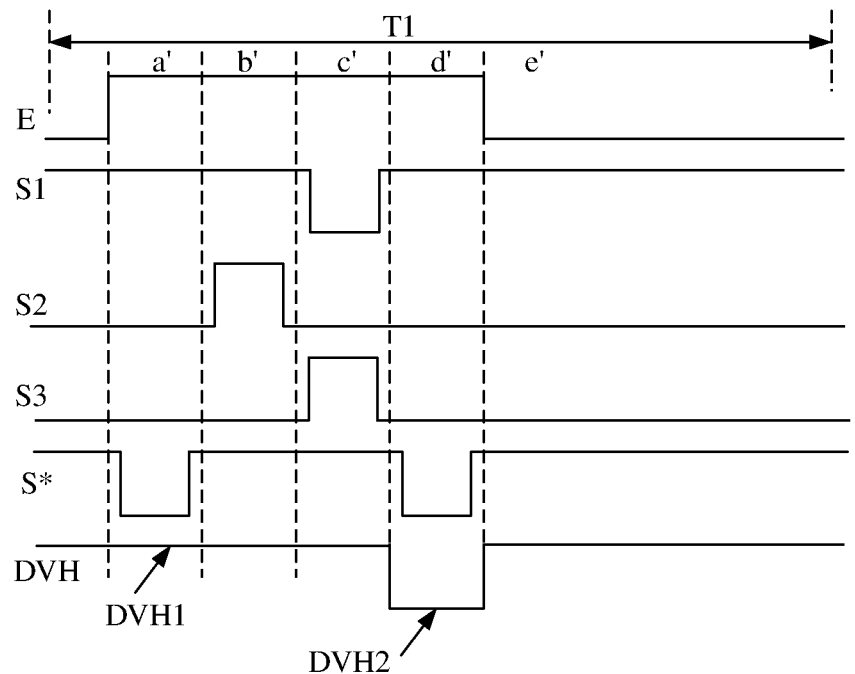
FIG. 5 is an operating timing sequence diagram of a pixel drive circuit shown in FIG. 4 during a data writing period according to some embodiments of the present disclosure.

Referring to FIG. 4 and FIG. 5, FIG. 5 is an operating timing sequence diagram of a pixel drive circuit shown in FIG. 4 during a data writing period according to some embodiments of the present disclosure. The operation of the pixel driving circuit 100 shown in FIG. 4 during the data writing period T1 is described as follows.

During the first adjusting stage a', the adjusting control terminal S* transmits an enable signal, the adjusting transistor M1 is turned on, the first adjusting signal DVH1 provided by the adjusting signal terminal DVH is written to the second node N2, and the potential of the second node N2 is: $V_{N2}=V_{DVH1}$.

During the first node reset period b', the second scan control terminal S2 transmits an enable signal, and the fourth transistor M24 and the sixth transistor M26 are turned on. The first reset signal provided by the first reset signal terminal Ref1 resets the first node N1 through the fourth transistor M24. The potential of the first node N1 satisfies: $V_{N1}=V_{Ref1}$. The second reset signal provided by the second reset signal terminal Ref2 resets the light-emitting element 200 through the sixth transistor M26.

During a data writing stage c', the first scan control terminal S1 transmits an enable signal, and the first transistor M21 is turned on. The signal of the data signal terminal Vdata is written to the second node N2, $V_{N2}$=Vdata. During this period, the third scan control terminal S3 transmits an enable signal, the fifth transistor M25 is turned on, the first node N1 and the third node N3 are electrically connected to each other, and $V_{N1}=V_{N3}$. The signal of the data signal terminal Vdata charges the first node N1 through the driving transistor M0 and the fifth transistor M25 until the potential of the first node N1 changes to $V_{N1}$=Vdata−|Vth|, where Vth denotes a threshold voltage of the driving transistor M0. Then, the data writing and the threshold compensation are completed.

During the second adjusting stage d', the adjusting control terminal S* transmits an enable signal, and the adjusting transistor M1 is turned on again. During this period, the adjusting signal terminal DVH provides the second adjusting signal DVH2. The second adjusting signal DVH2 is written to the second node N2 through the adjusting transistor M1, so that the potential of the second node N2 is: $V_{N2}=V_{DVH2}$.

During the light-emitting period e', the light-emitting control signal terminal E transmits an enable signal, and the second transistor M22 and the third transistor M23 are turned on. The first scan control terminal S1, the second scan control terminal S2, the third scan control terminal S3, and the adjusting control terminal S* all transmit a non-enable level, so that the adjusting transistor M1, the first transistor M21, the fourth transistor M24, and the fifth transistor M25, and the sixth transistor M26 are all turned off. The first node N1 keeps $V_{N1}$=Vdata−|Vth| under the storage capacitor Cst. $V_{N2}=V_{PVDD}$. The driving transistor M0 is turned on, a current controlled by the potential of the first node N1 flows through the light-emitting element 200 to light up the light-emitting element 200.

As shown in FIG. 5, in some embodiments of the present disclosure, the adjusting control terminal S* provides an enable signal twice in one data writing period T1, so as to provide the signal for turning on the adjusting circuit 12 during the first adjusting stage a' and the second adjusting stage d' respectively. The adjusting signal terminal DVH provides the first adjusting signal DVH1 during the first adjusting stage a', and provides the second adjusting signal DVH2 during the second adjusting stage d'. Exemplarily, the settings of the first adjusting signal DVH1 and the second adjusting signal DVH2 can be adjusted according to the operating requirements of the pixel driving circuit. For example, the first adjusting signal DVH1 and the second adjusting signal DVH2 can be different. During the data writing stage c' or other periods in which it is not necessary to use the adjusting signal terminal DVH to adjust the potential of the second node N2, the potential of the adjusting signal terminal DVH can be maintained as the first adjusting signal DVH1 or the second adjusting signal DVH2, which is not limited thereto. FIG. 5 is a schematic diagram of making the adjusting signal terminal DVH maintain the first adjusting signal DVH1 between the first adjusting stage a' and the second adjusting stage d'.

Figure 6:
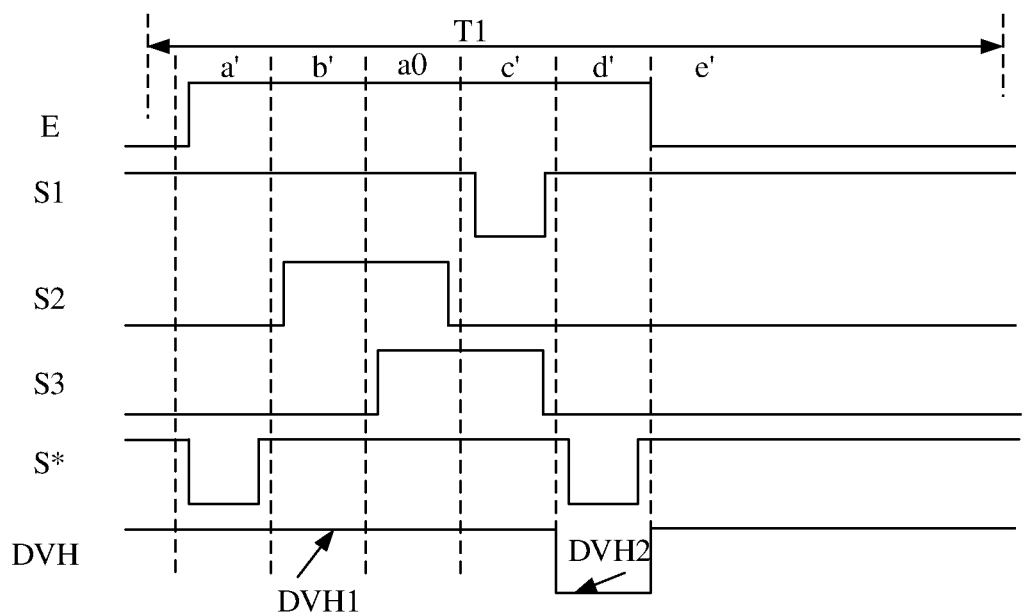
FIG. 6 is an operating timing sequence diagram of the pixel driving circuit shown in FIG. 4 during a data writing period according to other embodiments of the present disclosure.

FIG. 6 is an operating timing sequence diagram of the pixel driving circuit shown in FIG. 4 during a data writing period according to other embodiments of the present disclosure. Exemplarily, as shown in FIG. 6, a third node reset period a0 can be set during the data writing period T1. The third node reset period a0 is between the first node reset period b' and the data writing stage c'. During the third node reset period a0, the second scan control terminal S2 and the third scan control terminal S3 both provide an enable level, that is, during the third node reset period a0, the fourth transistor M24 and the fifth transistor M25 in the pixel driving circuit 100 shown in FIG. 4 are both turned on, and the reset signal provided by the first reset signal terminal Ref1 can reset the third node N3 through the fourth transistor M24 and the fifth transistor M25 that are turned on.

Figure 7:
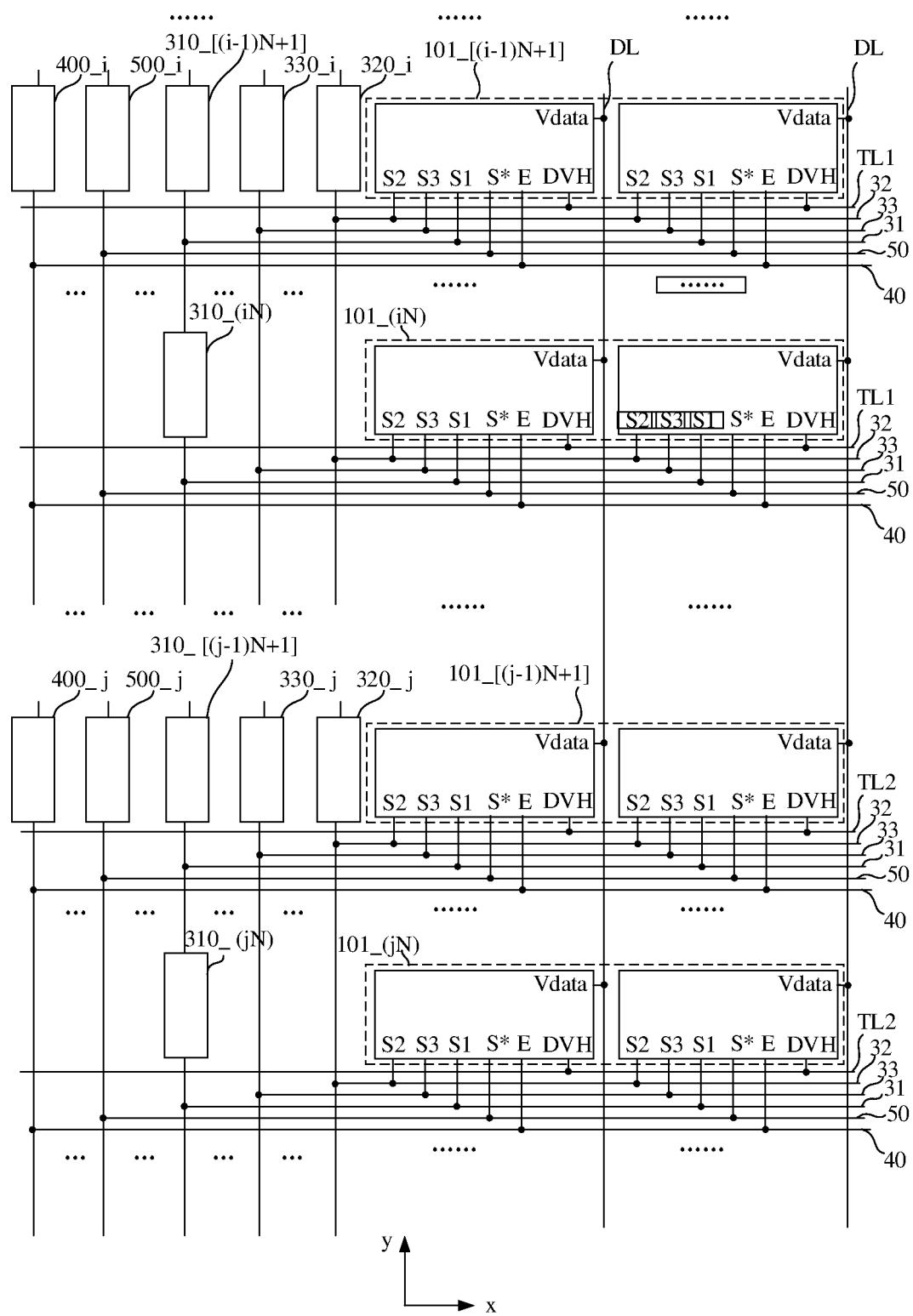
FIG. 7 is a schematic diagram of a display panel according to other embodiments of the present disclosure.

FIG. 7 is a schematic diagram of a display panel according to other embodiments of the present disclosure. Exemplarily, the display panel includes multiple pixel driving circuits shown in FIG. 4. Multiple pixel driving circuits which are arranged along the first direction x form a pixel driving circuit row 101. In FIG. 7, the (iN)$^{th}$ pixel driving circuit row in the display panel according to the scanning sequence of the display panel is represented by 101_(iN). The display panel can include multiple first scan control lines 31, multiple second scan control lines 32, multiple third scan control lines 33, multiple light-emitting control lines 40, multiple regulation control lines 50, and multiple data lines DL.

Exemplarily, the first scan control line 31, the second scan control line 32, the third scan control line 33, the light-emitting control line 40, and the regulation control line 50 each can extend along the first direction x.

Exemplarily, the display panel can include a regulation driving circuit, a first scanning driving circuit, a second scanning driving circuit, a third scanning driving circuit, and a light-emitting control circuit.

As shown in FIG. 7, the first scan driving circuit includes multiple first scan driving units 310 that are cascaded. In FIG. 7, 310_i represents an $i^{th}$ first scan driving unit 310 in the display panel according to the scanning sequence of the display panel, and one first scan driving unit 310 is electrically connected to multiple first scan control terminals S1 in a pixel driving circuit row 101 through one first scan control line 31.

The second scan driving circuit includes multiple second scan driving units 320 that are cascaded. In FIG. 7, 320_i indicates an $i^{th}$ second scan driving unit 320 in the display panel according to the scanning sequence of the display panel, and one second scan driving unit 320 is electrically connected to multiple second scan control terminals S2 in one or more pixel driving circuit rows 101 through one or more second scan control lines S2.

The third scan driving circuit includes multiple third scan driving units 330 cascaded. In FIG. 7, 330_i represents an $i^{th}$ third scan driving unit 330 in the display panel according to the scan sequence of the display panel. A third scan driving unit 330 is electrically connected to multiple third scan control terminals S3 in one or more pixel driving circuit rows 101 through one or more third scan control lines 33.

The light-emitting control circuit includes multiple light-emitting driving units 400 that are cascaded, and 400_i in FIG. 7 represents an $i^{th}$ light-emitting driving unit 400 in the display panel according to the scanning sequence of the display panel. One light-emitting driving unit 400 is electrically connected to multiple light-emitting control signal terminals E in one or more pixel driving circuit rows through one or more light-emitting control lines 40.

The regulation driving circuit includes M adjusting control circuits 500 that are cascaded, and 500_i in FIG. 7 represents an $i^{th}$ adjusting control circuit 500 in the display panel according to the scanning sequence of the display panel. One adjusting control circuit 500 is electrically connected to multiple adjusting control terminals S* in the N pixel driving circuit rows through one or more regulation control lines 50. N is an integer greater than or equal to 2. The N pixel driving circuit rows 101 that are electrically connected to a same one adjusting control circuit 500 are defined below as one pixel driving circuit row group. That is, multiple adjusting control terminals S* in a same pixel driving circuit row group are electrically connected to a same adjusting control circuit 500. M is an integer greater than or equal to 2, and N is an integer greater than or equal to 1.

The data line DL extends along the second direction y. Multiple data lines DL are arranged along the first direction x. One data line DL is electrically connected to multiple data signal terminals Vdata in one pixel driving circuit column 102.

Figure 8:
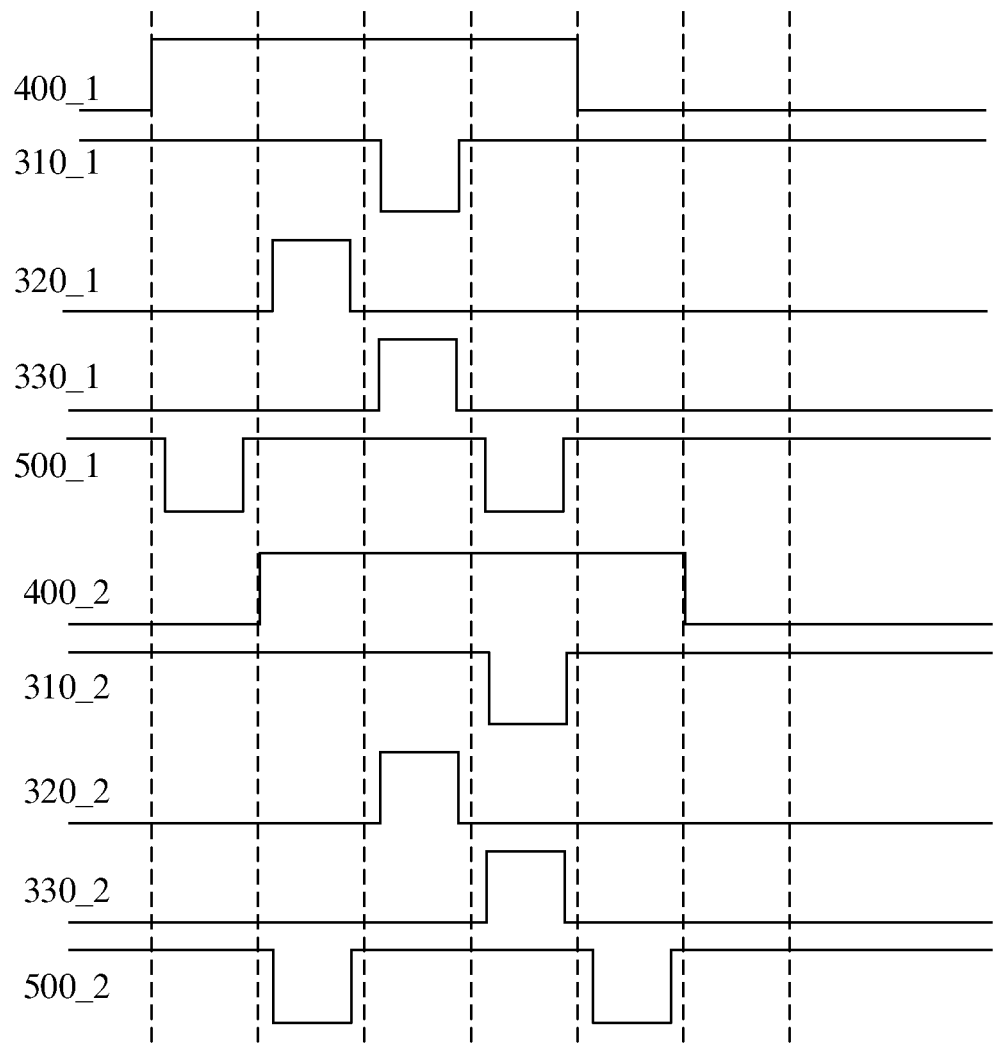
FIG. 8 is an operating timing sequence diagram corresponding to FIG. 7 according to some embodiments of the present disclosure.

When a first scan driving unit, a second scan driving unit, a third scan driving unit, a light-emitting control circuit, and an adjusting control circuit are all electrically connected to one pixel driving circuit row 101, exemplarily, as shown in FIG. 8 which is an operating timing sequence diagram corresponding to FIGS. 7, 400_1 and 400_2 respectively represent the signals output by the first light-emitting control circuit and the second light-emitting control circuit in the display panel according to the scanning sequence of the display panel; 310_1 and 310_2 respectively represent the signals output by the first one of the first scanning driving units and the second one of the first scanning driving units in the display panel according to the scanning sequence of the display panel; 320_1 and 320_2 respectively represent the signals output by the first one of the second scanning driving units and the second one of the second scanning driving units in the display panel according to the scanning sequence of the display panel; 330_1 and 330_2 respectively represent the signals output by the first one of the third scanning driving units and the second one of the third scanning driving units in the display panel according to the scanning sequence of the display panel; and 500_1 and 500_2 respectively represent the signals output by the first adjusting control circuit and the second adjusting control circuit in the display panel according to the scanning sequence of the display panel. In some embodiments of the present disclosure, the enable signal provided by the first scan driving unit 310, the enable signal provided by the second scan driving unit 320, the enable signal provided by the third scan driving unit 330, and the enable signal provided by the adjusting control circuit 500 last for a same time, that is, for any one pixel driving circuit 100, in some embodiments of the present disclosure, the time for resetting the first node N1 of the pixel driving circuit 100, the time for date writing of the driving transistor M0 of the pixel driving circuit 100, the duration of the first adjusting stage, and the duration of the second adjusting stage are equal to one another.

Figure 9:
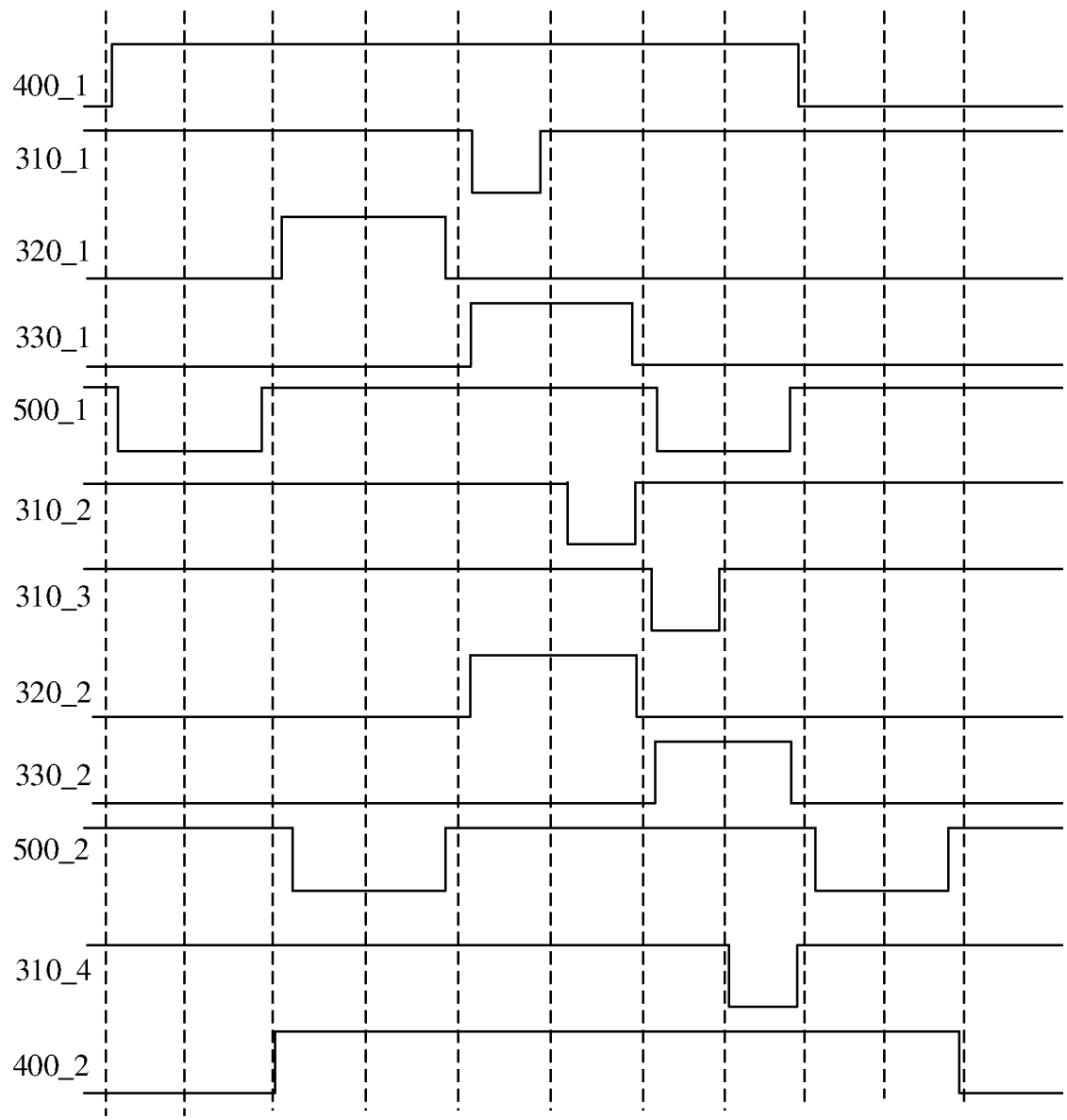
FIG. 9 is an operating timing sequence diagram corresponding to FIG. 7 according to other embodiments of the present disclosure.

Exemplarily, in some embodiments of the present disclosure, one second scan driving unit, one third scan driving unit, one light-emitting control circuit, and one adjusting control circuit can be electrically connected to two or more pixel driving circuit rows. When one second scan driving unit, one third scan driving unit, one light-emitting control circuit, and one adjusting control circuit each can be electrically connected to two or more pixel driving circuit rows, exemplarily, as shown in FIG. 9 that is another corresponding operating timing sequence diagram corresponding to FIG. 8, the meanings of the symbols are the same as the meanings of the corresponding symbols in FIG. 8, which will not be repeated herein. In some embodiments of the present disclosure, the width of the enable signal provided by the second scan driving unit 320, the width of the enable signal provided by the third scan driving unit 330, and the width of the enable signal provided by the adjusting control circuit 500 can be longer than the width of the enable signal provided by the first scan driving unit 310, that is, for any pixel driving circuit 100, the present disclosure can control the time for resetting the first node N1 of the pixel driving circuit 100, the first adjusting stage, and the second adjusting stage each are longer than the time for data writing to the pixel driving circuit.

As mentioned above, when the display panel operates, during one data writing period of any one pixel driving circuit, the adjusting control circuit 500 electrically connected to the pixel driving circuit sequentially outputs a first pulse corresponding to the first adjusting stage and a second pulse corresponding to the second adjusting stage, respectively. In some embodiments of the present disclosure, according to the scanning sequence of the display panel, the second pulse provided by the $i^{th}$ adjusting control circuit 500_i overlaps with the first pulse provided by the $j^{th}$ adjusting control circuit 500_j in the display panel, where i and j are both integers, and $1 \le i < j \le M$.

Referring to FIG. 7, the display panel can include a first adjusting signal line TL1 and a second adjusting signal line TL2. The first adjusting signal line TL1 is electrically connected to the adjusting circuit in the pixel drive circuit row group electrically connected to the $i^{th}$ adjusting control circuit 500_i, and the second adjusting signal line TL2 is electrically connected to the adjusting circuit of the pixel drive circuit row group electrically connected to the $j^{th}$ adjusting control circuit 500_j.

As shown in FIG. 7, according to the scanning sequence of the display panel, the pixel driving circuit row group electrically connected to the $i^{th}$ adjusting control circuit 500_i in the display panel includes N pixel driving circuit rows, i.e., an $[(i-1)N+1]^{th}$ pixel driving circuit row to an $(iN)^{th}$ pixel driving circuit row; and the pixel driving circuit row group electrically connected to the $j^{th}$ adjusting control circuit 500j in the display panel includes N pixel driving circuit rows, i.e., a $[(j-1)N+1]^{th}$ pixel driving circuit row to a $(jN)^{th}$ pixel driving circuit row. That is, the first adjusting signal line TL1 is electrically connected to the adjusting circuits 12 of the $[(i-1)N+1]^{th}$ pixel driving circuit row to the $(iN)^{th}$ pixel driving circuit row. The second adjusting signal line TL2 is electrically connected to the adjusting circuits 12 of the $[(j-1)N+1]^{th}$ pixel driving circuit row to the $(jN)^{th}$ pixel driving circuit row.

In some embodiments, as shown in FIG. 7, in some embodiments of the present disclosure, the first adjusting signal line TL1 and the second adjusting signal line TL2 each can extend along the first direction x, so that one first adjusting signal line TL1 can be electrically connected to multiple pixel driving circuits in one pixel driving circuit row 101, and one second adjusting signal line TL2 can be electrically connected to multiple pixel driving circuits in one pixel driving circuit row 101. With such a configuration, it is beneficial to reduce the number of first adjusting signal line TL1 and second adjusting signal line TL2.

Figure 10:
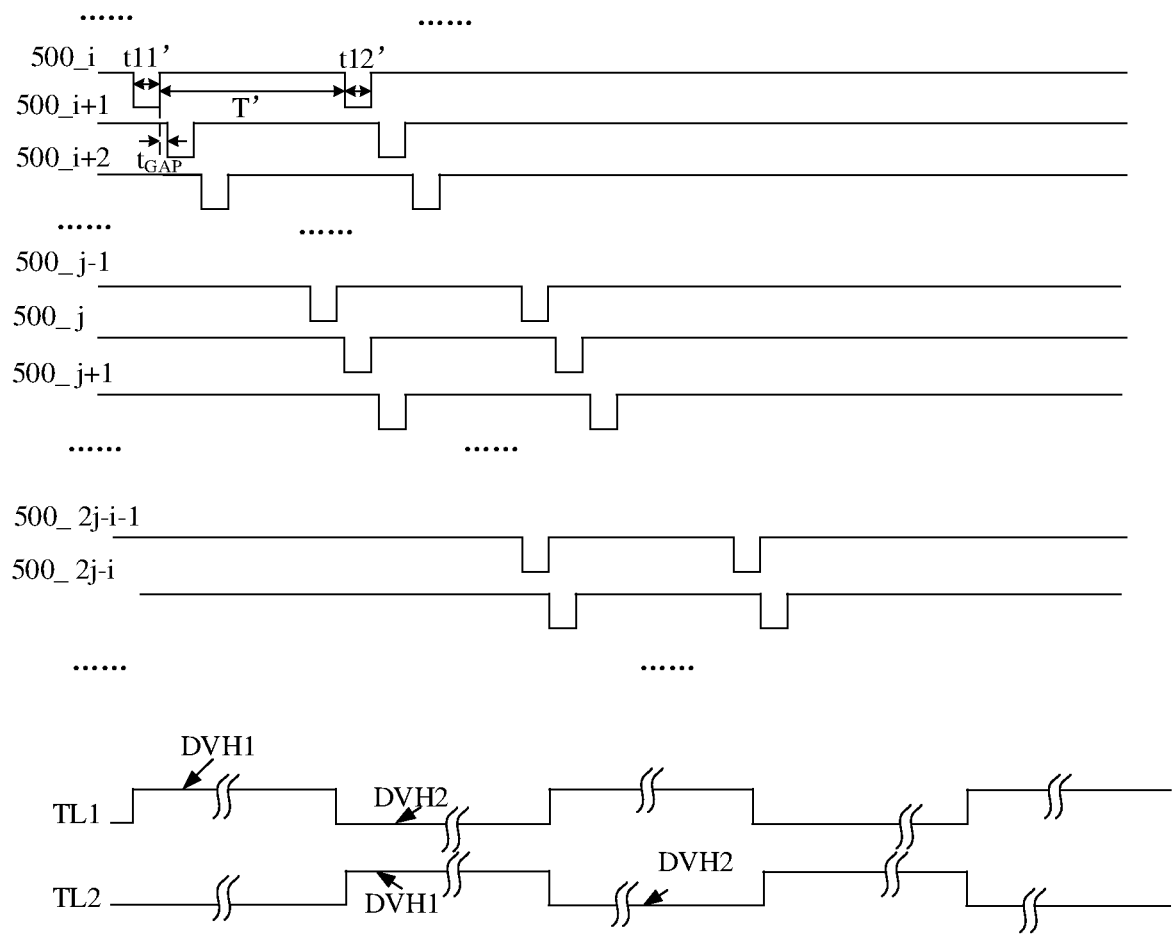
FIG. 10 illustrates timing sequence diagrams of an adjusting control circuit, a first adjusting signal line, and a second adjusting signal line according to some embodiments of the present disclosure.

FIG. 10 illustrates operating timing sequence diagrams of an adjusting control circuit, a first adjusting signal line, and a second adjusting signal line according to some embodiments of the present disclosure. Referring to FIG. 10, when the $i^{th}$ adjusting control circuit 500_i outputs a first pulse, the first adjusting signal line TL1 transmits the first adjusting signal DVH1. When the $i^{th}$ adjusting control circuit 500_i outputs the second pulse, the first adjusting signal line TL1 transmits the second adjusting signal DVH2. That is, a signal on the first adjusting signal line TL1 can be a varying alternative current signal. When the $j^{th}$ adjusting control circuit 500j outputs the first pulse, the second adjusting signal line TL2 transmits the first adjusting signal DVH1. When the $j^{th}$ adjusting control circuit 500_j outputs the second pulse, the second adjusting signal line TL2 transmits the second adjusting signal DVH2. That is, the signal on the second adjusting signal line TL2 can also be a varying alternative current signal.

In the present disclosure, the first adjusting signal line TL1 and the second adjusting signal line TL2 are provided to be electrically connected to different pixel drive circuit row groups that are electrically connected to the $i^{th}$ adjusting control circuit 500_i and the $j^{th}$ adjusting control circuit 500_j, so that the above operations of the first adjusting stage and the second adjusting stage can be independently performed for different pixel drive circuit row groups. While the regulation signal line TL1 performs the operation for the second adjusting stage on the pixel driving circuit row group electrically connected to the $i^{th}$ adjusting control circuit 500_i, the second adjusting signal line TL2 can also be used to perform operations during the first adjusting stage for the pixel driving circuit row group electrically connected to the $j^{th}$ adjusting control circuit 500_j, so that the scan time of the display panel can be reduced, thereby improving the refresh rate of the display panel.

In the embodiments of the present disclosure, the values of i and j are associated with the width of the first pulse, the width of the second pulse, and the interval between the two pulses output by the adjusting control circuit 500. Exemplarily, as shown in FIG. 10, taking all widths of the first pulses output by the respective adjusting control circuits 500 in the same frame being t11', all widths of the second pulses being t12', and the length of the interval between the first pulse and the second pulse being T as an example, according to the scanning sequence of the display panel, a duration from a time point when the $i^{th}$ adjusting control circuit 500_i in the display panel starts to output the first pulse to a time point when the $i^{th}$ adjusting control circuit 500_i in the display panel starts to output the second pulse is defined as A1, A1=t11'+T'. A duration from a time point when the $i^{th}$ adjusting control circuit 500_i in the display panel starts to output the first pulse to a time point when the $i^{th}$ adjusting control circuit 500_i in the display panel completes outputting the second pulse is defined as A2, and A2=t11'+T'+t12'. A duration from a time point when the $i^{th}$ adjusting control circuit 500_i in the display panel start to output the first pulse to a time point when the $j^{th}$ adjusting control circuit 500_j in the display panel starts to output the first pulse is defined as A3, A3=(j-i)(t11'+$t_{GAP}$) where $t_{GAP}$ denotes a time interval between the first pulses of two adjacent adjusting control circuits 500. A duration from a time point when the $i^{th}$ adjusting control circuit 500_i in the display panel start to output the first pulse to a time point when the $j^{th}$ adjusting control circuit 500_j in the display panel complete outputting the first pulse is defined as A4, and A4=(j-i+1)×t11'+(j-i)$t_{GAP}$. If the first pulse output by the $j^{th}$ adjusting control circuit 500_j overlaps with the second pulse output by the $i^{th}$ adjusting control circuit 500_i, the following formulas (1) and (2) must be satisfied:

$$A3<A2 \quad (1), \text{ and}$$

$$A4>A1 \quad (2).$$

The above formula (1) can be transformed into a following formula (3):

$$(j-i)(t11'+t_{GAP})<t11'+T'+t12' \quad (3).$$

The above formula (2) can be transformed into a following formula (4):

$$(j-i+1) \times t11'+(j-i)t_{GAP}>t11'+T' \quad (4).$$

Formula (3) and formula (4) perform a derivation to obtain:

$$T'/(t11'+t_{GAP})<(j-i)<1+(T'/t11'+t12')/(t11'+t_{GAP}) \quad (5).$$

When designing the connection relationship among the first adjusting signal line TL1, the second adjusting signal line TL2 in the display panel and the pixel driving circuit row, i and j can be determined according to N, T', t11', and t12'.

Exemplarily, when j-i≥2, in some embodiments of the present disclosure, the first adjusting signal line TL1 can be electrically connected to the adjusting circuits 12 of N(j-i-1) pixel drive circuit rows 101, i.e., the $(iN+1)^{th}$ pixel driving circuit row to the $(j-1)N^{th}$ pixel driving circuit row. The $(iN+1)^{th}$ pixel drive circuit row to the $(j-1)N^{th}$ pixel drive circuit row are sequentially electrically connected to the (j-i-1) adjusting control circuits 500, i.e., from the $(i+1)^{th}$ adjusting control circuit 500_(i+1) to the $(j-1)^{th}$ adjusting control circuit 500_(j-1) pixel drive circuit. Referring to FIG. 10, the first pulse and the second pulse of the (j-i-1) adjusting control circuits 500 do not overlap with the first pulse or the second pulse that are output by the $i^{th}$ adjusting control circuit 500_i. In this way, when using the first adjusting signal line TL1 and the second adjusting signal line TL2 to respectively perform the operations of the first adjusting stage and the second adjusting stage for multiple pixel driving circuit rows, the collision between the regulation signals written by the first adjusting stage and the second adjusting stage of different pixel driving circuit rows is avoided. Meanwhile, as shown in FIG. 10, since the first pulses output by the $(i+1)^{th}$ adjusting control circuit 500_$(i+1)$ to the $(j-1)^{th}$ adjusting control circuit 500_$(j-1)$ are all between the first pulse and the second pulse that are output by the $i^{th}$ adjusting control circuit 500_$i$, the first adjusting signal DVH1 transmitted by the first adjusting signal line TL1 can be maintained for a long time without frequent jumping. And, since the second pulses output by the $(i+1)^{th}$ adjusting control circuit 500_$(i+1)$ to the $(j-1)^{th}$ adjusting control circuit 500_$(j-1)$ are all after the second pulse output by the $i^{th}$ adjusting control circuit 500_$i$, therefore, the second adjusting signal DVH2 transmitted by the first adjusting signal line TL1 can also be maintained for a long time without frequent jumping, thereby reducing the power consumption of the display panel.

Similarly, in some embodiments of the present disclosure, the second adjusting signal line TL2 can also be electrically connected to the adjusting circuits 12 of N(j−i−1) pixel drive circuit rows 101, i.e., the $(jN+1)^{th}$ pixel driving circuit row 101 to the $(2j-i-1)N^{th}$ pixel driving circuit row 101. These N(j−i−1) pixel drive circuit rows 101 from the $(jN+1)^{th}$ pixel driving circuit row 101 to the $(2j-i-1)N^{th}$ pixel driving circuit row 101 are sequentially electrically connected to (j−i−1) adjusting control circuits 500 from the $(j+1)^{th}$ adjusting control circuit 500_$(j+1)$ to the $(2j-i-1)^{th}$ adjusting control circuit 500_$(2j-i-1)$. Referring to FIG. 10, the first pulses and the second pulses of the (j−i−1) adjusting control circuits 500 do not overlap with the first pulse or the second pulse output by the $j^{th}$ adjusting control circuit 500_$j$. In this way, when using the first adjusting signal line TL1 and the second adjusting signal line TL2 to respectively perform the operations performed during the first adjusting stage and the second adjusting stage for multiple pixel driving circuit rows, the collision between the regulation signals written by the first adjusting stage and the second adjusting stage of different pixel driving circuit rows is avoided. Meanwhile, as shown in FIG. 10, since the first pulses output by the $(j+1)^{th}$ adjusting control circuit 500_$(j+1)$ to the $(2j-i-1)^{th}$ adjusting control circuit 500_$(j-1)$ are all between the first pulse and the second pulse output by the $j^{th}$ adjusting control circuit 500_$j$, the first adjusting signal DVH1 transmitted by the second adjusting signal line TL2 can be maintained for a long time without frequent jumping. And, since the second pulses output by the $(j+1)^{th}$ adjusting control circuit 500_$(j+1)$ to the $(2j-i-1)^{th}$ adjusting control circuit 500_$(2j-i-1)$ are all after the second pulse output by the $j^{th}$ adjusting control circuit 500_$j$, therefore, the second adjusting signal DVH2 transmitted by the second adjusting signal line TL2 can also be maintained for a long time without frequent jumping, thereby reducing the power consumption of the display panel.

Exemplarily, according to the scanning sequence of the display panel, the first adjusting signal line TL1 is also electrically connected to the adjusting circuits 12 of [(j−i)N]pixel drive circuit rows 101 from the $[(2j-i-1)N+1]^{th}$ pixel driving circuit row 101 to the $[(3j-2i-1)N]^{th}$ pixel drive circuit row 101. These [(j−i)N] pixel drive circuit rows 101 from the $[(2j-i-1)N+1]^{th}$ pixel driving circuit row 101 to the $[(3j-2i-1)N]^{th}$ pixel drive circuit row 101 are sequentially electrically connected to (j−i) adjusting control circuits 500 from the $(2j-i)^{th}$ adjusting control circuit 500_$(2j-i)$ to the $(3j-2i-1)^{th}$ adjusting control circuit 500_$(3j-2i-1)$. The first pulses and the second pulses of the (j−i) adjusting control circuits 500 do not overlap with each other. The first adjusting signal line TL1 can be configured to provide the first adjusting signal DVH1 during the duration from the first pulse of the $(2j-i)^{th}$ adjusting control circuit to the first pulse of the $(3j-2i-1)^{th}$ adjusting control circuit, and, also to provide the second adjusting signal DVH2 during the duration from the second pulse of the $(2j-i)^{th}$ adjusting control circuit to the second pulse of the $(3j-2i-1)^{th}$ adjusting control circuit. In this way, the first adjusting signal line TL1 can be connected to a large number of pixel driving circuits, which is beneficial to reduce the number of the first adjusting signal lines TL1.

Similarly, the second adjusting signal line TL2 is also electrically connected to the adjusting circuits 12 of [(j−i)N] pixel drive circuit rows from the $[(3j-2i-1)N+1]^{th}$ pixel driving circuit row to the $[(4j-3i-1)N]^{th}$ pixel drive circuit row. These [(j−i)N] pixel drive circuit rows from the $[(3j-2i-1)N+1]^{th}$ pixel driving circuit row to the $[(4j-3i-1)N]^{th}$ pixel drive circuit row are sequentially electrically connected to (j−i) adjusting control circuits 500 from the $(3j-2i)^{th}$ adjusting control circuit to the $(4j-3i-1)^{t}$ (j−i) adjusting control circuit. In this way, the second adjusting signal line TL2 can be connected to a large number of pixel driving circuits, which is beneficial to reduce the number of the second adjusting signal line TL2.

Exemplarily, in the scanning sequence of the display panel, starting from the first one of the adjusting control circuits 500, in some embodiments of the present disclosure, (j−i) adjacent adjusting control circuits 500 can form one adjusting control circuit group. Correspondingly, in the scanning sequence of the display panel, starting from the first one of pixel driving circuit rows 101, in some embodiments of the present disclosure, [(i−i)] pixel driving circuit row groups that are electrically connected to (j−i) adjacent adjusting control circuits 500 can form one pixel driving circuit row group unit. In some embodiments of the present disclosure, starting from the first one of pixel driving circuit row units, different pixel driving circuit row units are alternately electrically connected to the first adjusting signal line TL1 and the second adjusting signal line TL2. That is, multiple pixel driving circuits in odd-numbered pixel driving circuit row group units are connected to the first adjusting signal line TL1, and multiple pixel driving circuits in even-numbered pixel driving circuit row group units are connected to the second adjusting signal line TL2. With such configuration, it not only enables each pixel driving circuit to independently perform the operations performed during the first adjusting stage and the second adjusting stage, but also reduces the number of jumping of the signals on the first adjusting signal line TL1 and the second adjusting signal line TL2. The first adjusting signal line TL1 and the second adjusting signal line TL2 can also be connected to a large number of pixel driving circuits, which is beneficial to reduce the number of regulation signal lines in the display panel.

Figure 11:
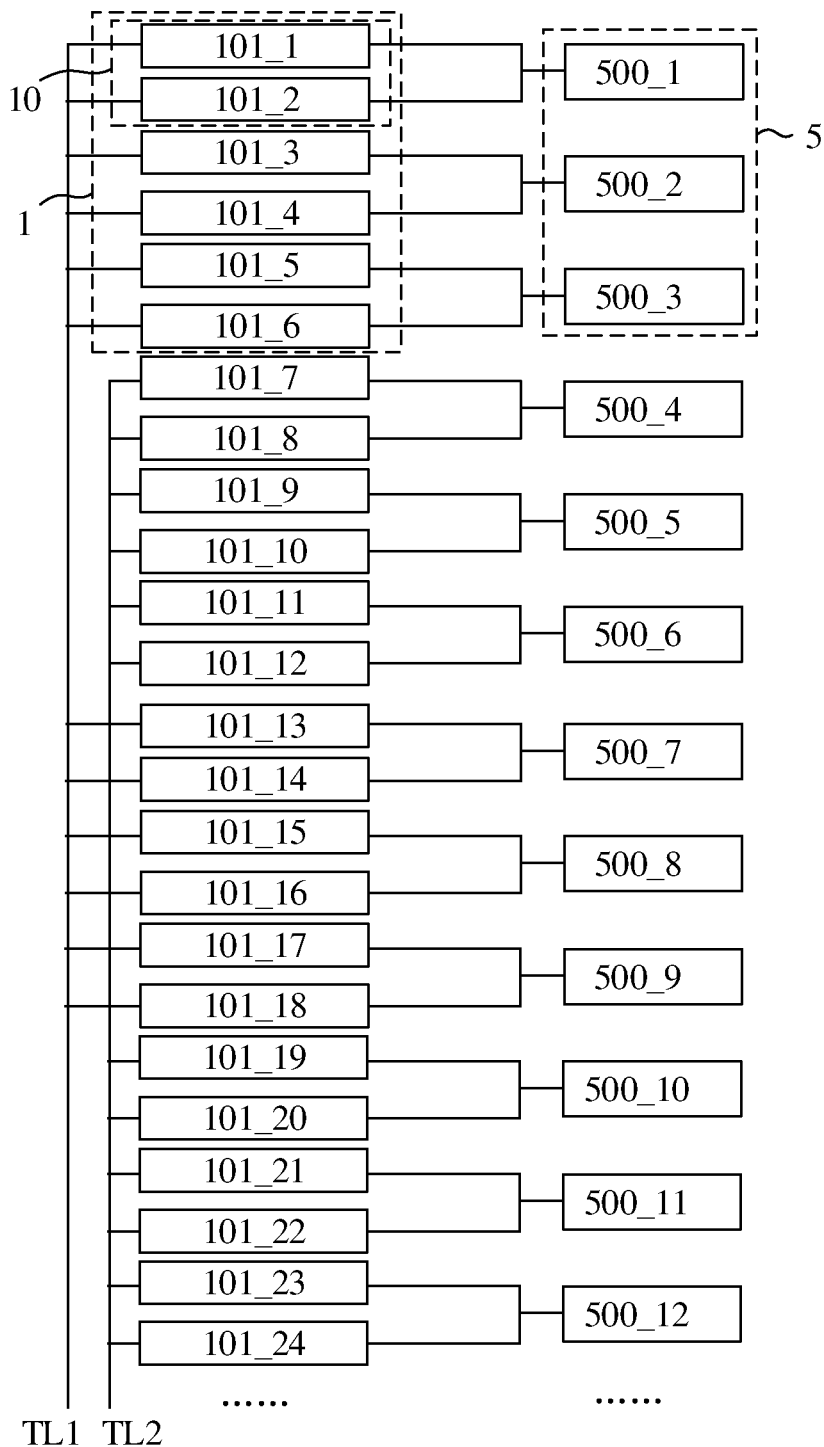
FIG. 11 is a schematic diagram of a display panel according to other embodiments of the present disclosure.
Figure 12:
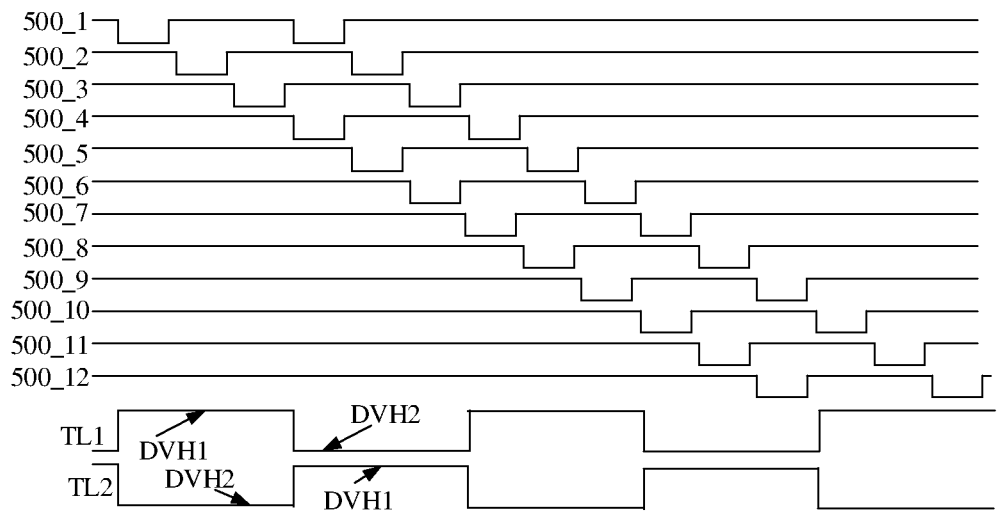
FIG. 12 is an operating timing sequence diagram corresponding to FIG. 11 according to some embodiments of the present disclosure.

In some embodiments of the present disclosure, i=1, j=4, N=2. FIG. 11 is a schematic diagram of a display panel according to other embodiments of the present disclosure; and FIG. 12 is an operating timing sequence diagram corresponding to FIG. 11 according to some embodiments of the present disclosure. As shown in FIG. 11, 101_1 represents a first one of the pixel drive circuit rows, and 500_1 represents a first one of the adjusting control circuits. As shown in FIG. 12, 500_1 represents the signal output by the first one of the adjusting control circuits. It can be seen that the adjusting control circuit group 5 is electrically connected to three pixel drive circuit row groups 10, each pixel drive circuit row group 10 includes two pixel driving circuit row 101 and six pixel driving circuit rows 101 connected to the adjusting control circuit group 5 form one pixel driving circuit row group unit 1. The odd-numbered pixel driving circuit row group units 1 are electrically connected to the first adjusting signal line TL1, and the even-numbered pixel driving circuit row group units 1 are electrically connected to the second adjusting signal line TL2.

Figure 13:
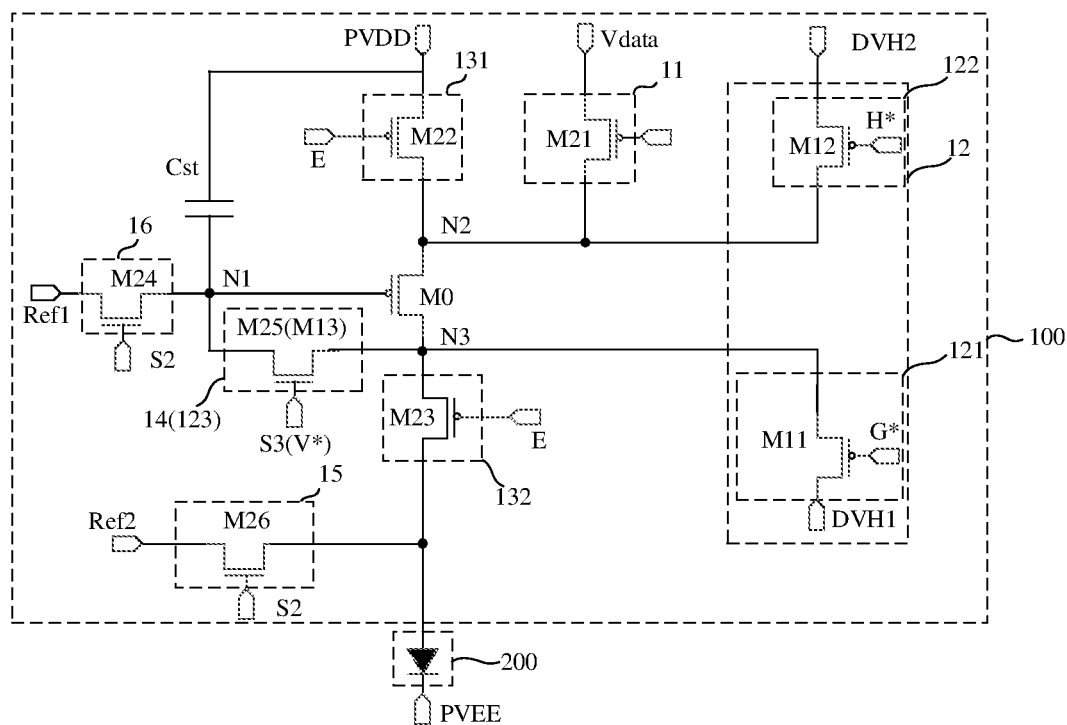
FIG. 13 is a schematic diagram of an equivalent circuit of a sub-pixel according to other embodiments of the present disclosure.

FIG. 13 is a schematic diagram of an equivalent circuit of a sub-pixel according to other embodiments of the present disclosure. In some embodiments, as shown in FIG. 3 and FIG. 13, the sub-pixel includes a pixel driving circuit 100 and a light-emitting element 200. The pixel driving circuit 100 includes an adjusting circuit 12. The adjusting circuit 12 includes a first adjusting sub-circuit 121 and a second adjusting sub-circuit 122. A first terminal of the first adjusting sub-circuit 121 is electrically connected to the first adjusting signal terminal DVH1, and a second terminal of the first adjusting sub-circuit 121 is electrically connected to the third node N3. A first terminal of the second adjusting sub-circuit 122 is electrically connected to the second adjusting signal terminal DVH2, and a second terminal of the second adjusting sub-circuit 122 is electrically connected to the second node N2. The first adjusting signal terminal DVH1 transmits the first adjusting signal DVH1, and the second adjusting signal terminal DVH2 transmits the second adjusting signal DVH2. The first adjusting sub-circuit 121 is configured to transmit the first adjusting signal DVH1 to the third node N3 during the first adjusting stage. The second adjusting sub-circuit 122 is configured to transmit the second adjusting signal DVH2 to the second node N2 during the second adjusting stage.

Exemplarily, as shown in FIG. 13, the first adjusting sub-circuit 121 includes a first adjusting sub-transistor M11. The second adjusting sub-circuit 122 includes a second adjusting sub-transistor M12. A control electrode of the first adjusting sub-transistor M11 is electrically connected to a first adjusting control sub-terminal G*. A control electrode of the second adjusting sub-transistor M12 is electrically connected to a second adjusting control sub-terminal H*. As shown in FIG. 13, the implementation manner of the transistors of the data writing circuit 11 and other circuits can be the same as that in FIG. 4, which will not be repeated herein.

When the pixel driving circuit 100 is operated, during the first adjusting stage, the first adjusting sub-circuit 121 is turned on to provide the first adjusting signal DVH1 to the third node N3; and during the second adjusting stage, the second adjusting sub-circuit 122 is turned on to provide the second adjusting signal DVH2 to the second node N2.

Figure 14:
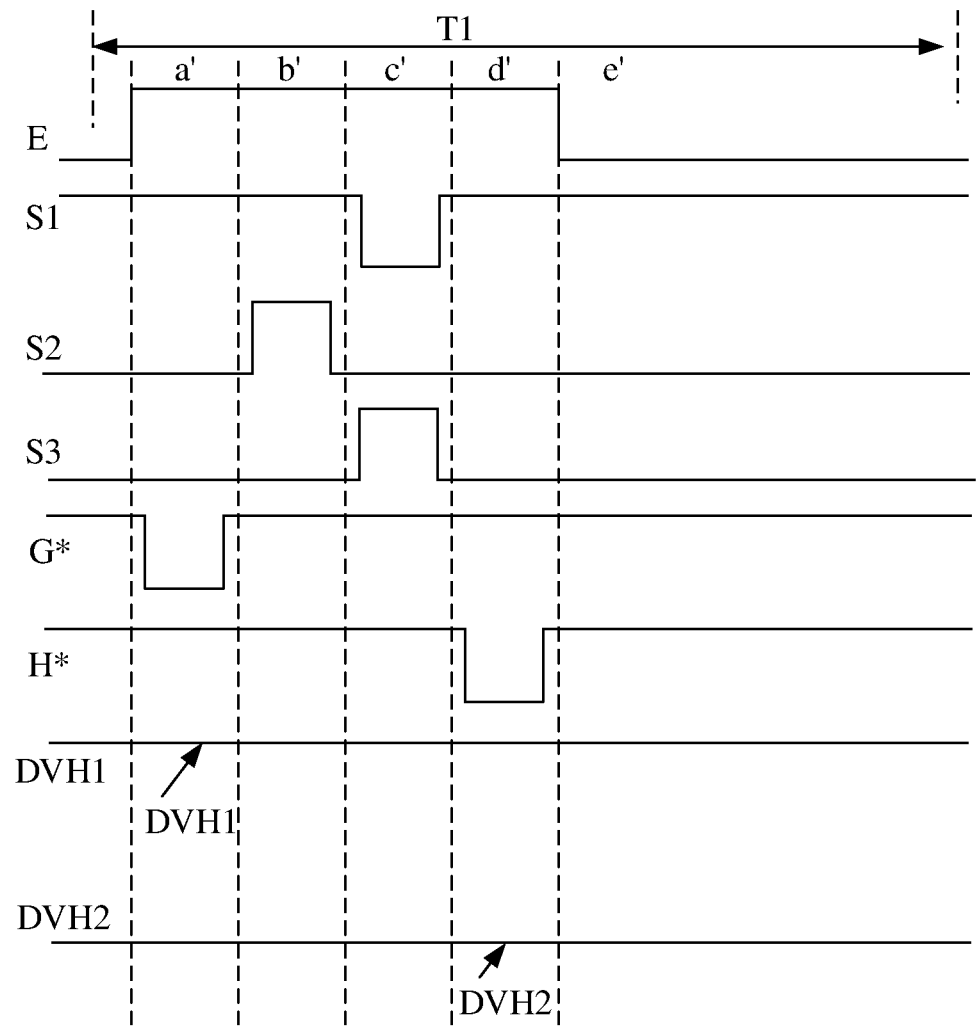
FIG. 14 is an operating timing sequence diagram of the pixel driving circuit shown in FIG. 13 during a data writing period according to some embodiments of the present disclosure.

FIG. 14 is an operating timing sequence diagram of the pixel driving circuit shown in FIG. 13 during a data writing period according to some embodiments of the present disclosure. As shown in FIG. 14, the first adjusting control sub-terminal G* provides an enable signal during the first adjusting stage a', so that the first adjusting sub-transistor M11 is turned on; the first adjusting signal terminal DVH1 provides the first adjusting signal DVH1 during the first adjusting stage a; the second adjusting control sub-terminal H* provides an enable signal during the second adjusting stage d', so that the second adjusting sub-transistor M12 is turned on; and the second adjusting signal terminal DVH2 provides the second adjusting signal DVH2 during the second adjusting stage d'.

Exemplarily, as shown in FIG. 14, the first adjusting signal terminal DVH1 and/or the second adjusting signal terminal DVH2 are configured to provide a constant signal, so as to reduce the power consumption of the display panel.

Figure 15:
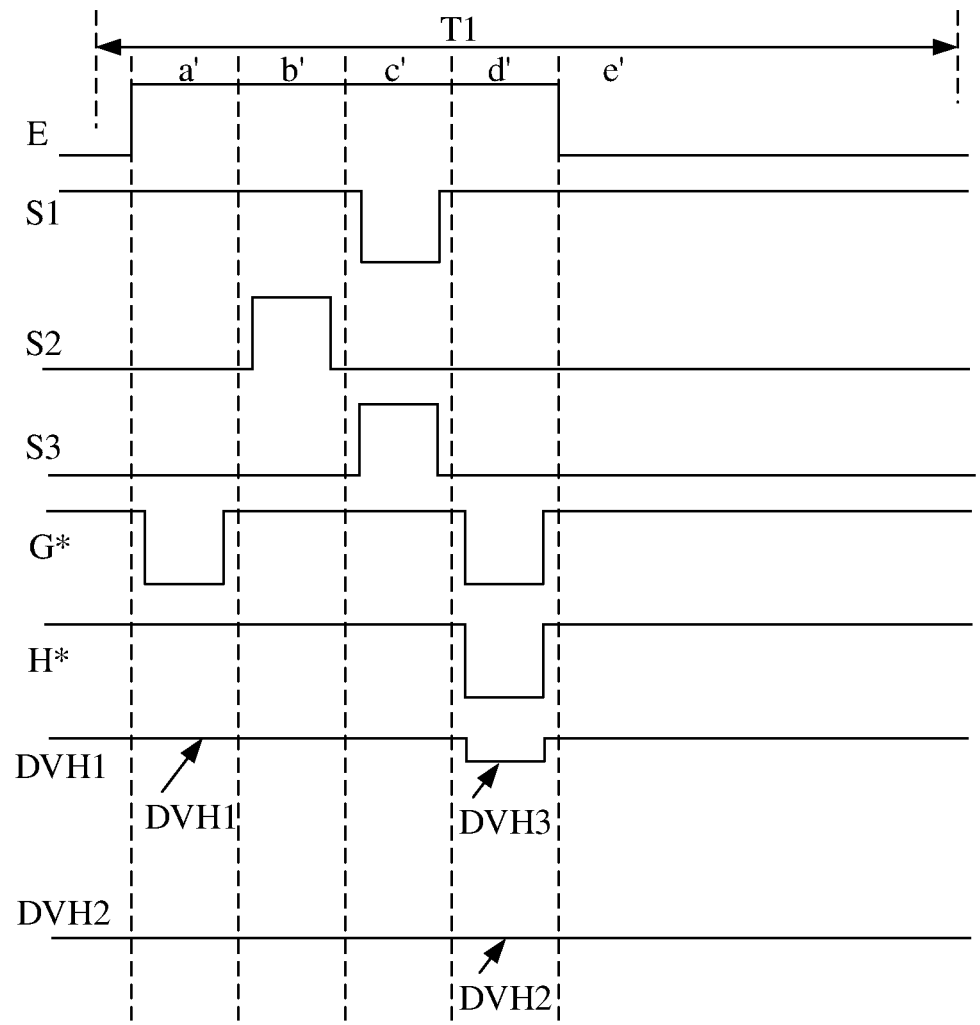
FIG. 15 is an operating timing sequence diagram of the pixel driving circuit shown in FIG. 13 during a data writing period according to other embodiments of the present disclosure.

When the second electrode of the first adjusting sub-transistor M11 is electrically connected to the third node N3, exemplarily, referring to FIG. 13 and FIG. 15, FIG. 15 is an operating timing sequence diagram of the pixel driving circuit shown in FIG. 13 during a data writing period according to other embodiments of the present disclosure, the first adjusting control sub-terminal G* can also provide an enable signal during the second adjusting stage d', and the first adjusting signal terminal DVH1 is also configured to provide the third adjusting signal DVH3 during the second adjusting stage d'. Exemplarily, the third adjusting signal DVH3 can be associated with the data signal written by the data writing circuit 11 during the current driving cycle. With such configuration, the current leakage from the first node N1 to the third node N3 during the second adjusting stage d' can be avoided. In some embodiments, the third adjusting signal DVH3 and the second adjusting signal DVH2 can be the same.

Figure 16:
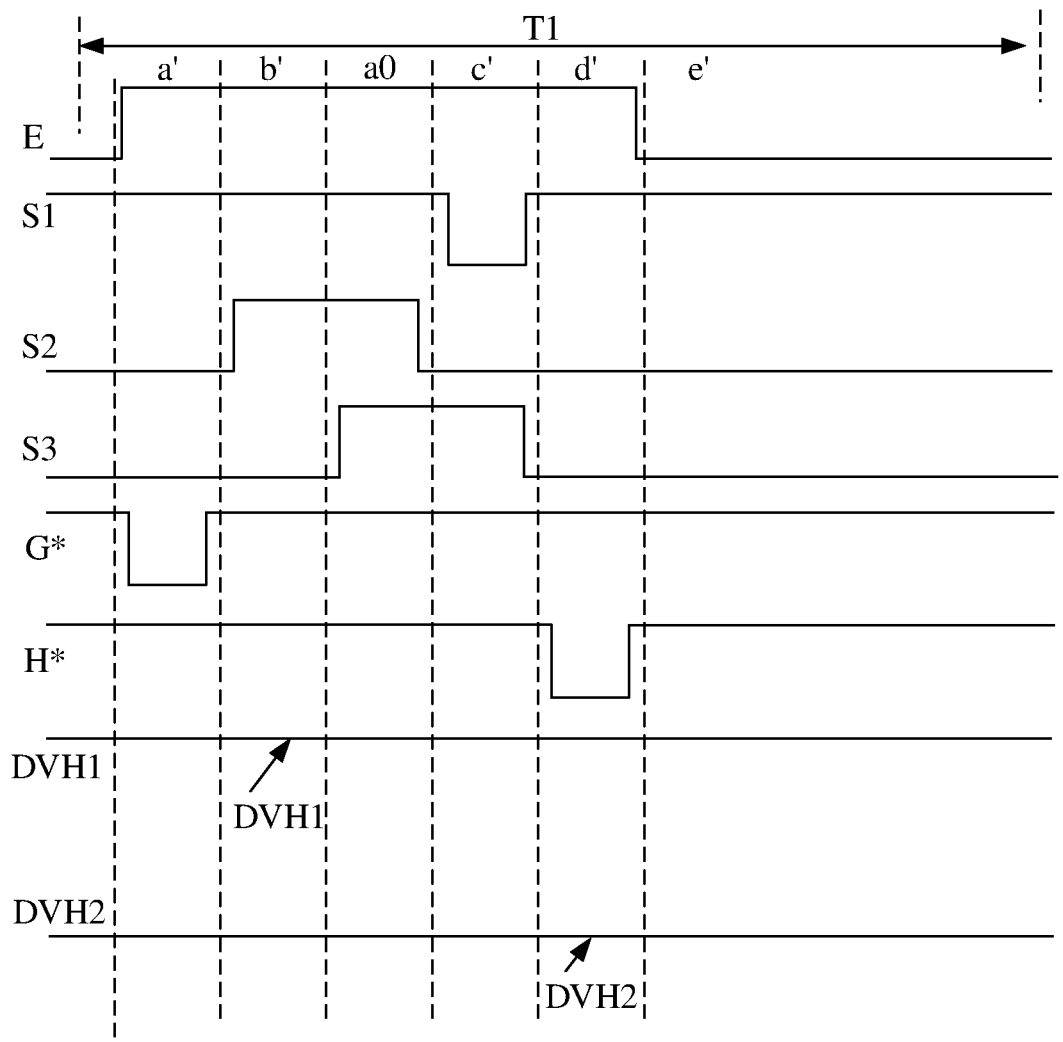
FIG. 16 is an operating timing sequence diagram of the pixel driving circuit shown in FIG. 13 during a data writing period according to other embodiments of the present disclosure.

FIG. 16 is an operating timing sequence diagram of the pixel driving circuit shown in FIG. 13 during a data writing period according to other embodiments of the present disclosure. Exemplarily, as shown in FIG. 16, a third node reset period a0 can be added in the data writing period. The third node reset period a0 is between the first node reset period b' and the data writing stage c'. During the third node reset period a0, the second scan control terminal S2 and the third scan control terminal S3 both provide an enable level. That is, during the third node reset period a0, the fourth transistor M24 and the fifth transistor M25 of the pixel driving circuit 100 shown in FIG. 13 are both turned on, and the reset signal provided by the first reset signal terminal Ref1 can reset the third node N3 through the fourth transistor M24 and the fifth transistor M25 that are turned on.

Exemplarily, as shown in FIG. 2, FIG. 3, FIG. 4 and FIG. 13, the pixel driving circuit 100 can include a third adjusting sub-circuit 123. A first terminal of the third adjusting sub-circuit 123 is electrically connected to the first node N1, and a second terminal of the adjusting sub-circuit 123 is electrically connected to the third node N3. The third adjusting sub-circuit 123 is configured to connect the first node N1 with the third node N3 during the first adjusting stage a'. As shown in FIG. 4, during the first adjusting stage a', when the first adjusting signal DVH1 is provided to the second node N2 through the adjusting circuit 12, the first adjusting signal DVH1 can be written to the first node N1 through the driving transistor M0 and the third adjusting sub-circuit 123, so as to perform potential refresh on the first node N1. As shown in FIG. 13, during the first adjusting stage a', when the first adjusting signal DVH1 is provided to the third node N3 through the adjusting circuit 12, the first adjusting signal DVH1 can be written to the first node N1 through the third adjusting sub-circuit 123, so as to perform potential refresh on the first node N1. With such configuration, the control electrode, the first electrode, and the second electrode of the driving transistor M0 can be refreshed during the first adjusting stage a', which is beneficial to improve the device characteristics of the driving transistor M0.

Exemplarily, as shown in FIG. 4 and FIG. 13, the third adjusting sub-circuit 123 includes a third adjusting sub-transistor M13. A control electrode of the third adjusting sub-transistor M13 is electrically connected to the third adjusting control sub-terminal V*, and a first electrode of the adjusting sub-transistor M13 is electrically connected to the third node N3, and a second electrode of the third adjusting sub-transistor M13 is electrically connected to the first node N1.

Figure 17:
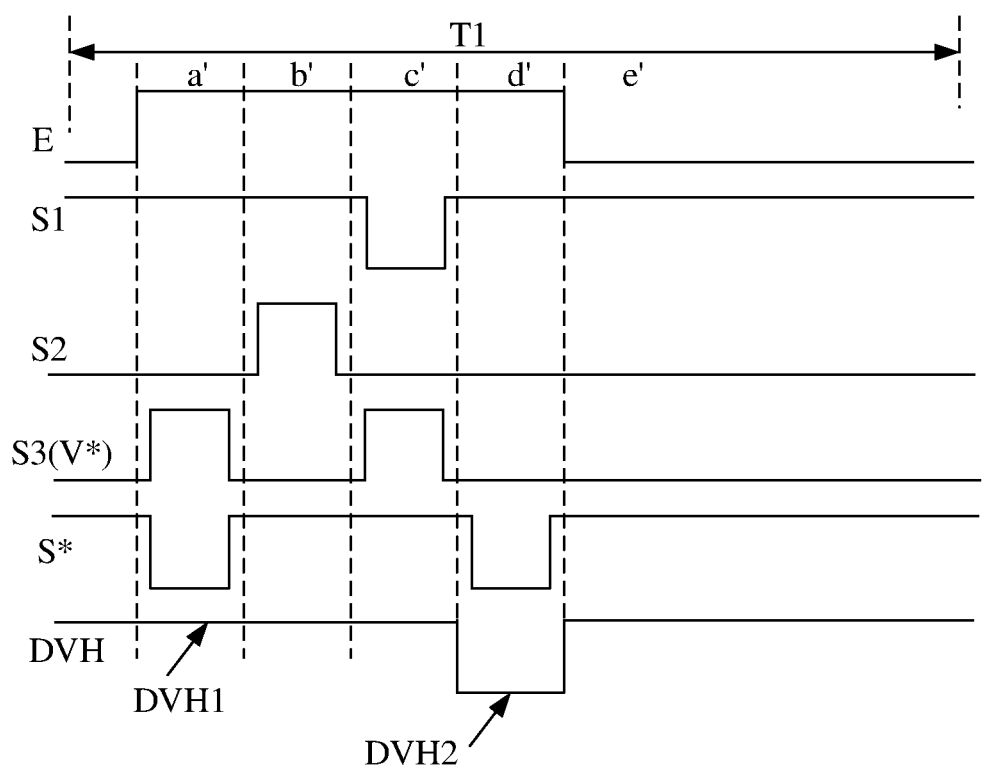
FIG. 17 is an operating timing sequence diagram of the pixel drive circuit shown in FIG. 4 during a data writing period according to other embodiments of the present disclosure.
Figure 18:
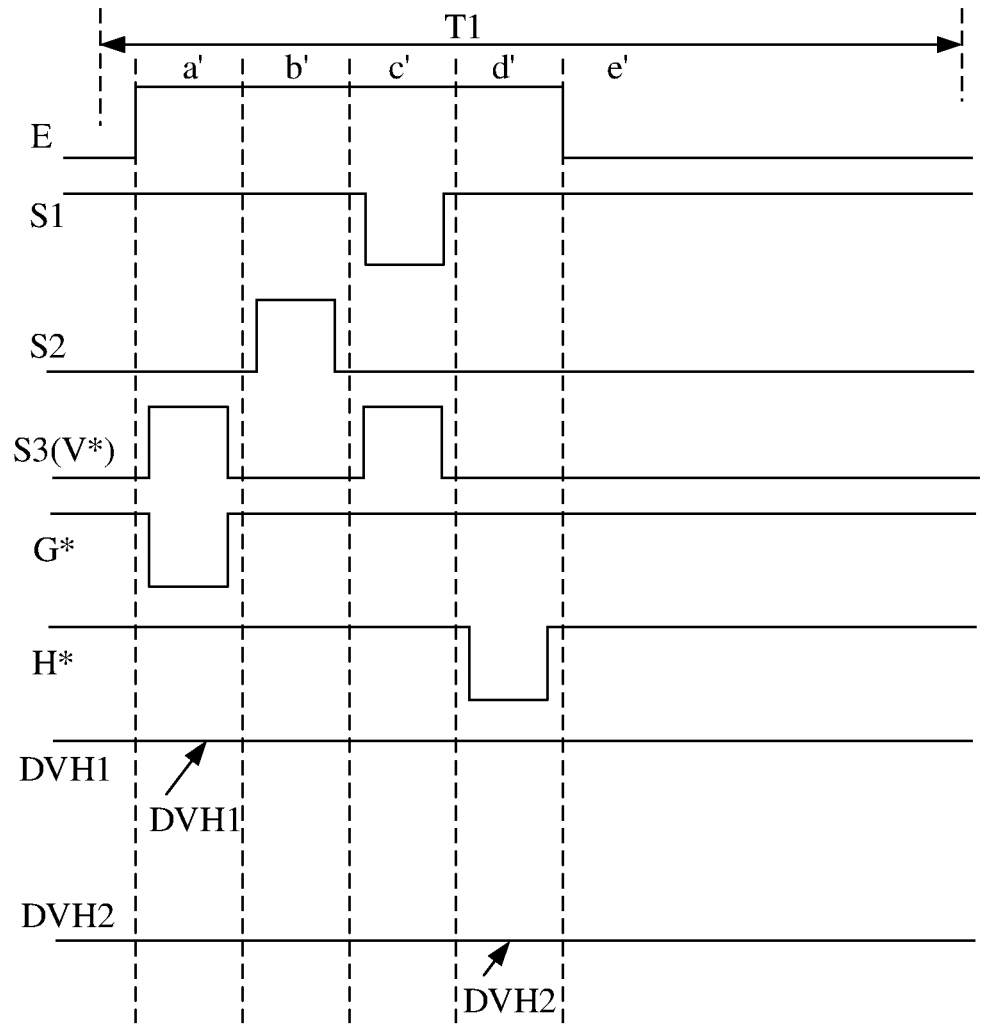
FIG. 18 is an operating timing sequence diagram of the pixel driving circuit shown in FIG. 13 during a data writing period according to other embodiments of the present disclosure.

In some embodiments, as shown in FIG. 2 and FIG. 3, in some embodiments of the present disclosure, the threshold compensation circuit 14 can be reused as a third adjusting sub-circuit 123. As shown in FIG. 4 and FIG. 13, in some embodiments of the present disclosure, the fifth transistor M25 can be reused as the third adjusting sub-transistor M13, and the third scan control terminal S3 can be reused as the third adjusting control sub-terminal V*. That is, the third scan control terminal S3 is configured to provide the enable signal during the first adjusting stage a' in addition to providing the enable signal during the data writing stage c'. That is, the third adjusting sub-circuit 123 is also configured to realize the function of compensating the threshold voltage of the driving transistor. Referring to FIG. 17 and FIG. 18, FIG. 17 is an operating timing sequence diagram of the pixel drive circuit shown in FIG. 4 during a data writing period according to other embodiments of the present disclosure; and FIG. 18 is an operating timing sequence diagram of the pixel driving circuit shown in FIG. 13 during a data writing period according to other embodiments of the present disclosure, in addition to providing the enable level during the data writing stage c', the third scan control terminal S3 also provides the enable level during the first adjusting stage a'. With such configuration, the three terminals of the driving transistor M0 are refreshed during the first adjusting stage a', and the device characteristics of the driving transistor M0 are improved, and a relatively small number of the transistors can be provided in the pixel driving circuit 100, which is beneficial to simplify the structure of the pixel driving circuit.

Figure 19:
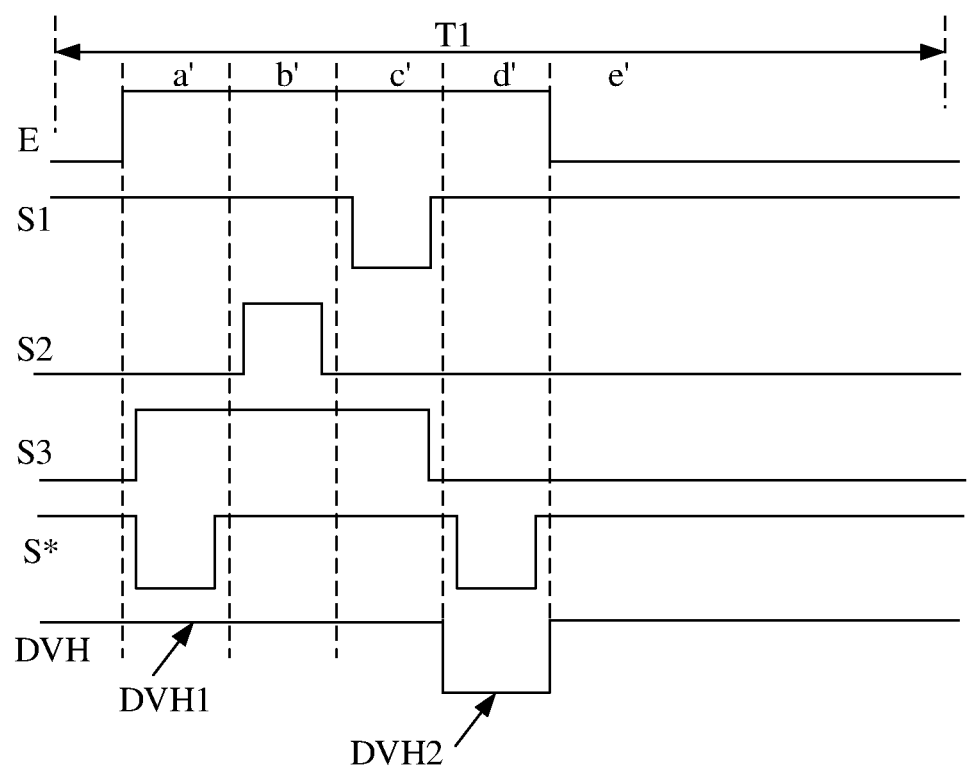
FIG. 19 is an operating timing sequence diagram of the pixel drive circuit shown in FIG. 4 during a data writing period according to other embodiments of the present disclosure.
Figure 20:
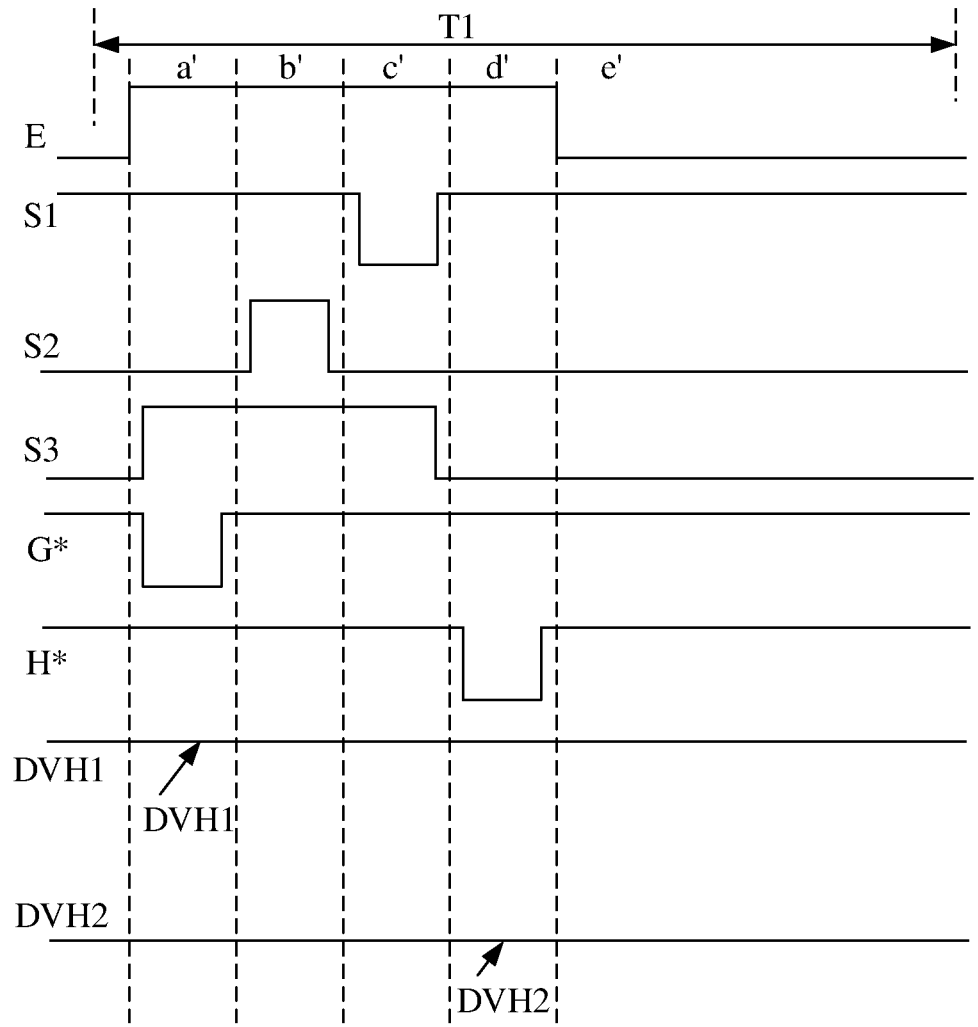
FIG. 20 is an operating timing sequence diagram of the pixel driving circuit shown in FIG. 13 during a data writing period according to other embodiments of the present disclosure.

FIG. 19 is an operating timing sequence diagram of the pixel drive circuit shown in FIG. 4 during a data writing period according to other embodiments of the present disclosure; and FIG. 20 is an operating timing sequence diagram of the pixel driving circuit shown in FIG. 13 during a data writing period according to other embodiments of the present disclosure. In some embodiments, as shown in FIG. 19 and FIG. 20, the third scan control terminal S3 can also provide an enable signal during the first node reset period b', that is, when the signal of the first reset signal terminal Ref1 resets the first node N1, the signal of the first reset signal terminal Ref1 can also be written to the third node N3 through the fifth transistor M25.

Figure 21:
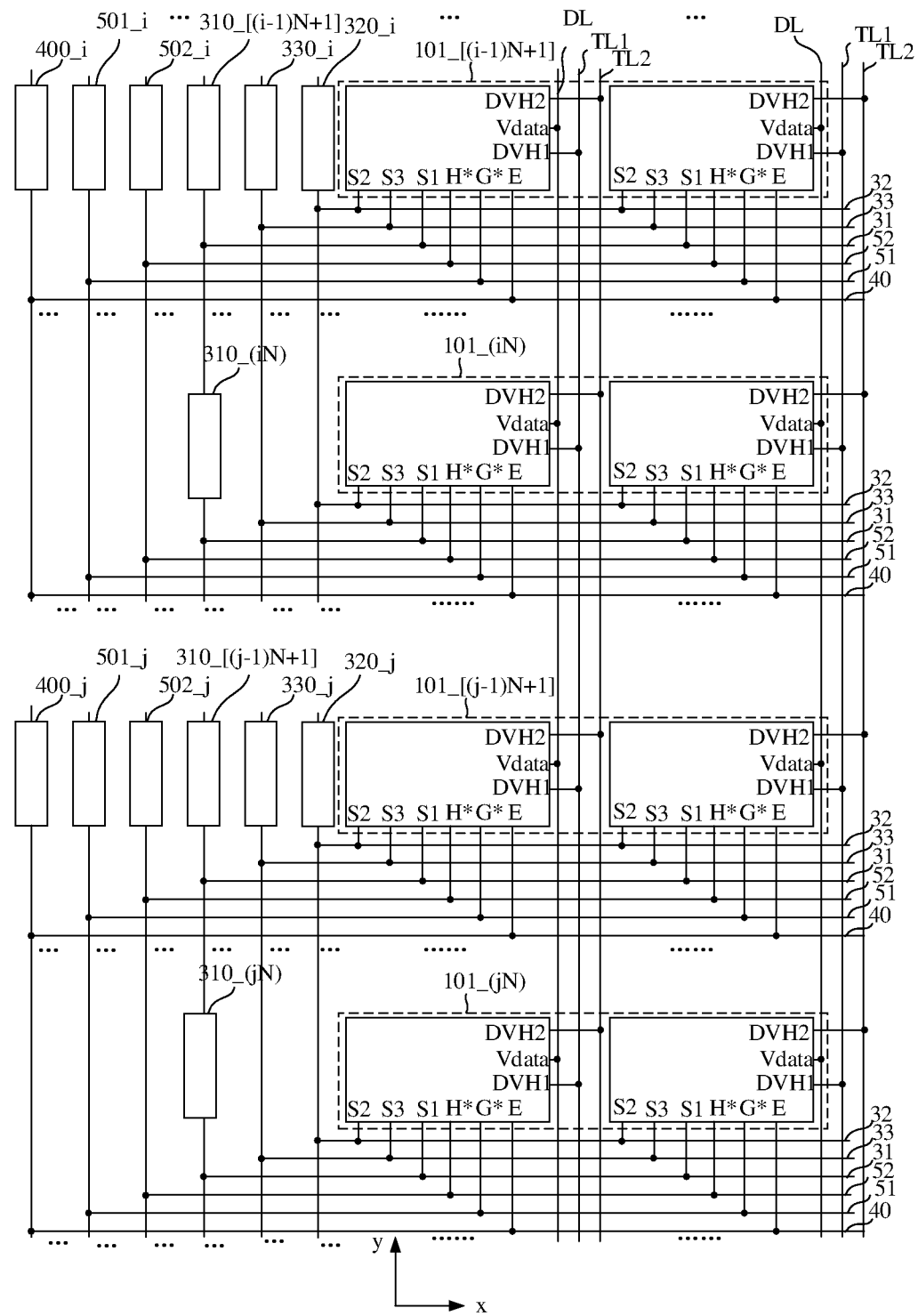
FIG. 21 is a schematic diagram of a display panel according to other embodiments of the present disclosure.

FIG. 21 is a schematic diagram of a display panel according to other embodiments of the present disclosure. Exemplarily, as shown in FIG. 21, the display panel includes multiple pixel driving circuits shown in FIG. 13. Multiple pixel driving circuits arranged along the first direction x form a pixel driving circuit row 101. In FIG. 21, the 101_$(iN)^{th}$ represents an $(iN)^{th}$ pixel driving circuit row along the scanning sequence of the display panel. The display panel can include multiple first regulation control lines 51 and multiple second regulation control lines 52.

Exemplarily, the display panel includes a first regulation driving circuit and a second regulation driving circuit. As shown in FIG. 21, the first regulation driving circuit includes multiple cascaded first adjusting control circuits 501. The 501_$i$ in FIG. 21 represents the $i^{th}$ first adjusting control circuit according to the scanning sequence of the display panel. One first adjusting control circuit 501 is electrically connected to multiple first adjusting control sub-terminals G* in the N pixel driving circuit rows through one or more first regulation control lines 51. N is an integer greater than or equal to 1. The second regulation driving circuit includes multiple cascaded second adjusting control circuits 502. The 502_$i$ in FIG. 21 represents the $i^{th}$ second adjusting control circuit along the scanning sequence of the display panel. One second adjusting control circuit 502 is electrically connected to the N pixel driving circuit rows 101 through one or more second regulation control lines 52. That is, multiple second adjusting control sub-terminals H* in a same pixel driving circuit row group are electrically connected to a same second adjusting control circuit 502.

As shown in FIG. 21, the display panel can include a first adjusting signal line TL1 and a second adjusting signal line TL2. The first adjusting signal line TL1 is electrically connected to the first adjusting signal terminal DVH1 of each pixel driving circuit. The first adjusting signal line TL1 is configured to transmit the first adjusting signal DVH1 constantly. The second adjusting signal line TL2 is electrically connected to the second adjusting signal terminal DVH2 of each pixel driving circuit. The second adjusting signal line TL2 is configured to transmit the second adjusting signal DVH2 constantly.

Figure 22:
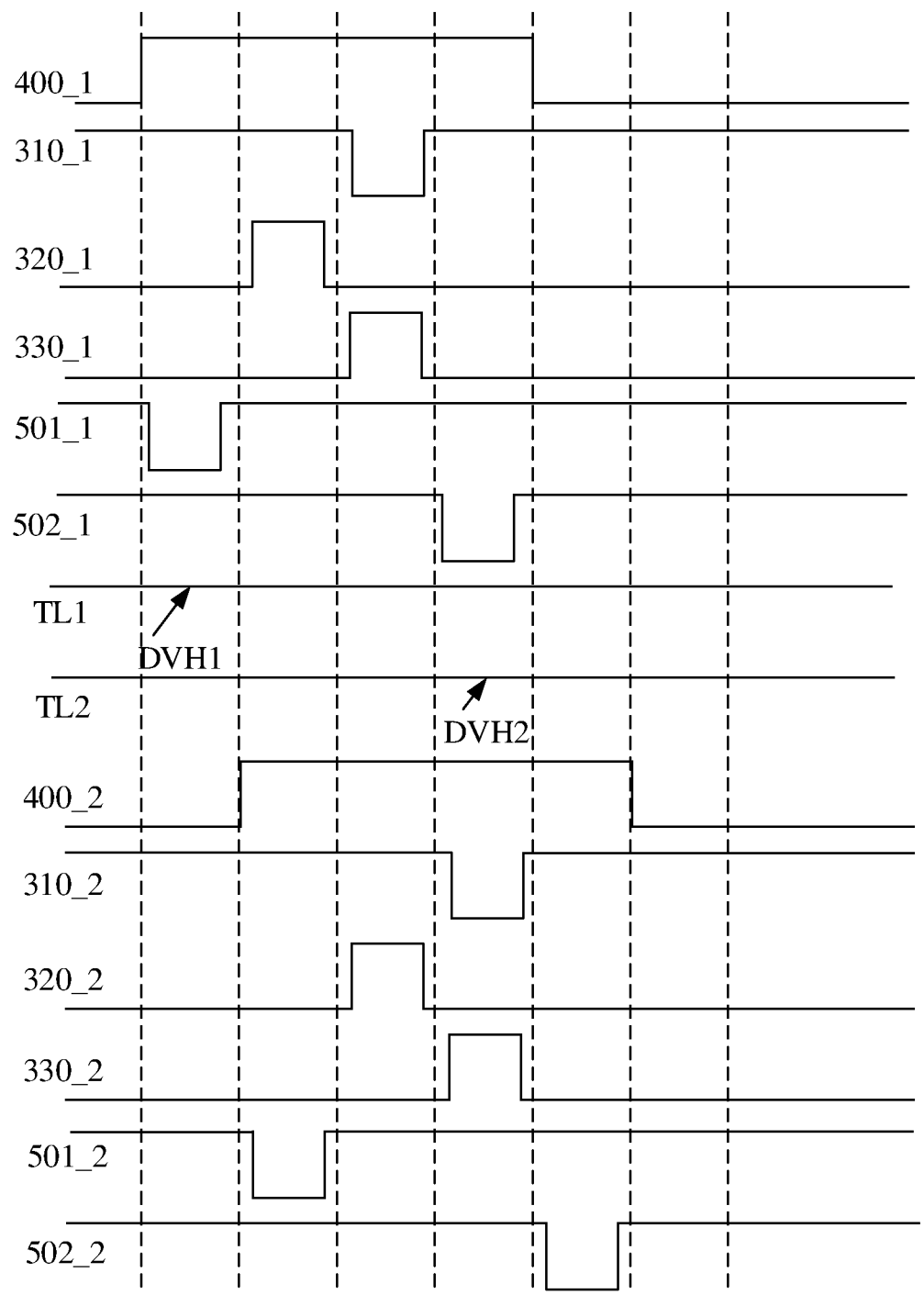
FIG. 22 is an operating timing sequence diagram corresponding to FIG. 21 according to some embodiments of the present disclosure.

When one first scan driving unit, one second scan driving unit, one third scan driving unit, one light-emitting control circuit and one adjusting control circuit are all electrically connected to one pixel driving circuit row, exemplarily, as shown in FIG. 22 which is an operating timing sequence diagram corresponding to FIG. 21 according to some embodiments of the present disclosure, 400_1 and 400_2 respectively represent the signals output by the first light-emitting control circuit and the second light-emitting control circuit according to the scanning sequence of the display panel, 310_1 and 310_2 respectively represent the signals output by the first one of the first scanning driving units and the second one of the first scanning driving units according to the scanning sequence of the display panel, 320_1 and 320_2 respectively represent the signals output by the first one of the second scanning driving units and the second one of second scanning driving units according to the scanning sequence of the display panel, 330_1 and 330_2 respectively represent the signals output by the first one of third scanning driving units and the second one of third scanning driving units along the scanning sequence of the display panel, 501_1 and 501_2 respectively represent the signals output by the first one of the first adjusting control circuits and the second one of the first adjusting control circuit along the scanning sequence of the display panel, and 502_1 and 502_2 respectively represent the signals output by the first one of the second adjusting control circuits and the second one of the second adjusting control circuit along the scanning sequence of the display panel. In some embodiments of the present disclosure, the width of the enable signal provided by the first scan driving unit 310, the width of the enable signal provided by the first adjusting control circuit 501 and the width of the enable signal provided by the second adjusting control circuit 502 can be the same, that is, for any pixel driving circuit 100, the present disclosure can control the data writing duration of the pixel driving circuit 100 to be equal to the duration for performing the first adjusting stage and the second adjusting stage.

Figure 23:
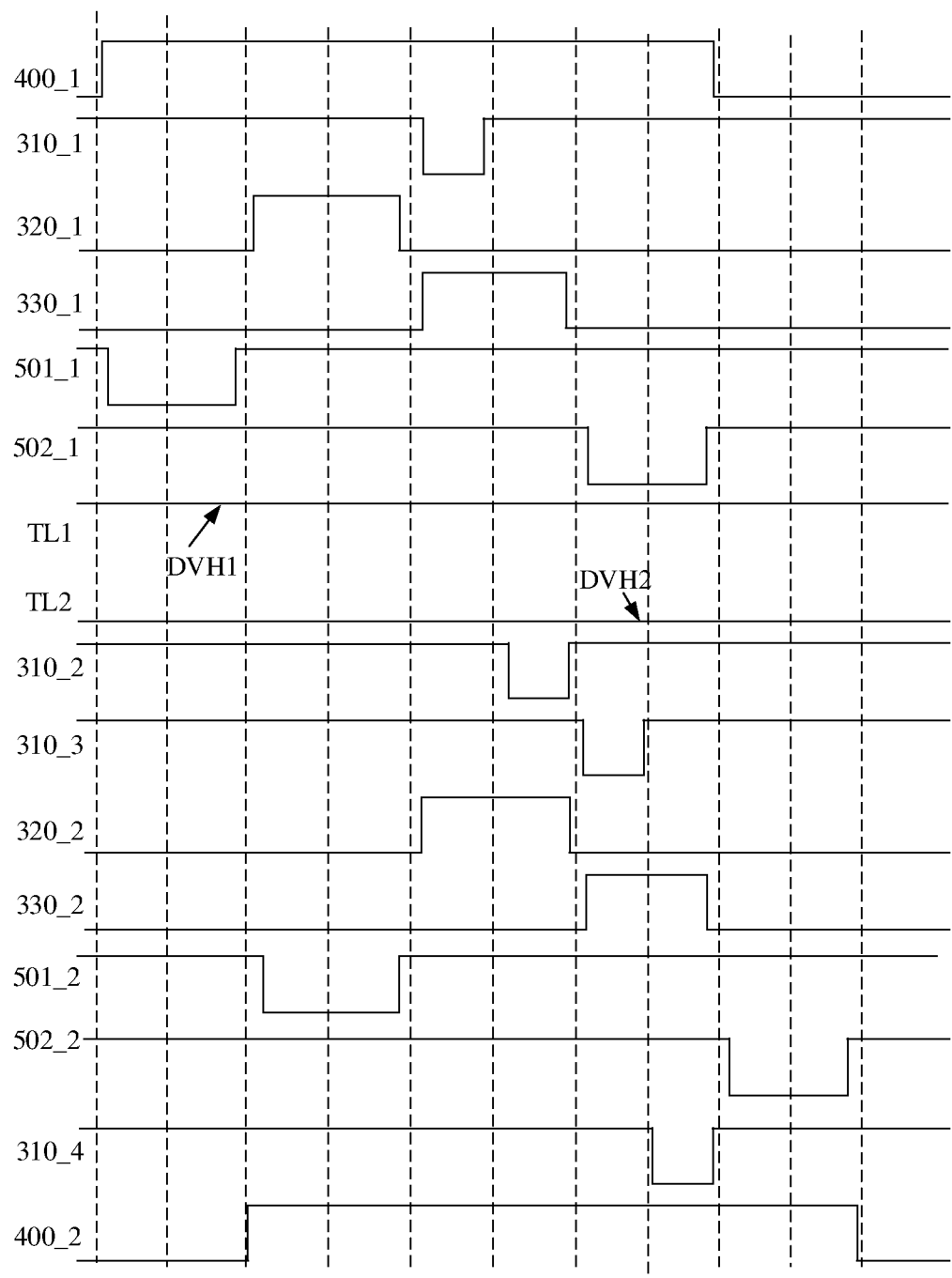
FIG. 23 is an operating timing sequence diagram corresponding to FIG. 21 according to other embodiments of the present disclosure.

In some embodiments of the present disclosure, one second scan driving unit, one third scan driving unit, one light-emitting control circuit, one first adjusting control circuit, and one second adjusting control circuit can be electrically connected to two or more pixel circuit driving rows, when one second scan driving unit, one third scan driving unit, one light-emitting control circuit, one first adjusting control circuit and one second adjusting control circuit are all electrically connected to two pixel drive circuit rows, exemplarily, as shown in FIG. 23 which is an operating timing sequence diagram corresponding to FIG. 21 according to other embodiments of the present disclosure, the meanings of the symbols are the same as those of the corresponding symbols in FIG. 22, which will not be repeated herein. In some embodiments of the present disclosure, the widths of the enable signals provided by the first adjusting control circuit 501 and the second adjusting control circuit 502 can be longer than the width of the enable signal provided by the first scan driving unit 310, that is, for any one pixel driving circuit 100, the present disclosure can control the duration for performing the operations of the first adjusting stage and the second adjusting stage for the pixel driving circuit 100 to be longer than the writing data duration of the pixel driving circuit.

It should be noted that FIG. 22 and FIG. 23 only schematically show setting each pixel driving circuit to operate according to the timing sequence shown in FIG. 14. In fact, the first scanning driving unit, the second scanning driving unit, the second scanning driving unit, the third scan driving unit, the first adjusting control circuit, and the second adjusting control circuit are configured to make the pixel drive circuit operate according to the timing sequence shown in any one of FIG. 15, FIG. 16, FIG. 17, FIG. 18, FIG. 19, and FIG. 20, which are not repeated herein.

Figure 24:
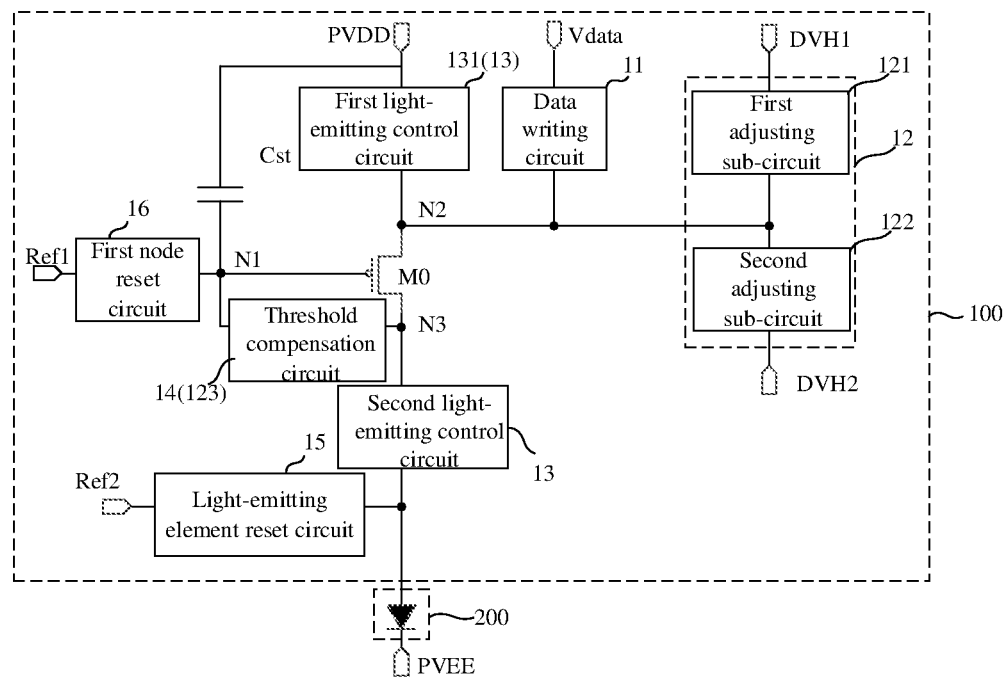
FIG. 24 is a schematic diagram of an equivalent circuit of a sub-pixel according to other embodiments of the present disclosure.

FIG. 24 is a schematic diagram of an equivalent circuit of a sub-pixel according to other embodiments of the present disclosure. In some embodiments, as shown in FIG. 24, the sub-pixel includes a pixel driving circuit 100 and a light-emitting element 200 that are electrically connected to each other. The pixel driving circuit 100 includes an adjusting circuit 12 electrically connected to the second node N2. Exemplarily, the adjusting circuit 12 includes a first adjusting sub-circuit 121 and a second adjusting sub-circuit 122. A first terminal of the first adjusting sub-circuit 121 is electrically connected to the first adjusting signal terminal DVH1, and a second terminal of the first adjusting sub-circuit 121 is electrically connected to the second node N2. A first terminal of the second adjusting sub-circuit 122 is electrically connected to the second adjusting signal terminal DVH2, and a second other terminal of the second adjusting sub-circuit 122 is electrically connected to the second node N2. The first adjusting signal terminal DVH1 transmits the first adjusting signal DVH1, and the second adjusting signal terminal DVH2 transmits the second adjusting signal DVH2. The first adjusting sub-circuit 121 is configured to transmit the first adjusting signal DVH1 to the second node N2 during the first adjusting stage; and the second adjusting sub-circuit 122 is configured to transmit the second adjusting signal DVH2 to the second node N2 during the second adjusting stage.

When the pixel driving circuit operates, during the first adjusting stage, the first adjusting sub-circuit 121 is turned on to transmit the first adjusting signal DVH1 provided by the first adjusting signal terminal DVH1 to the second node N2. During the second adjusting stage, the second adjusting sub-circuit 122 is turned on to transmit the second adjusting signal DVH2 provided by the second adjusting signal terminal DVH2 to the second node N2.

Figure 25:
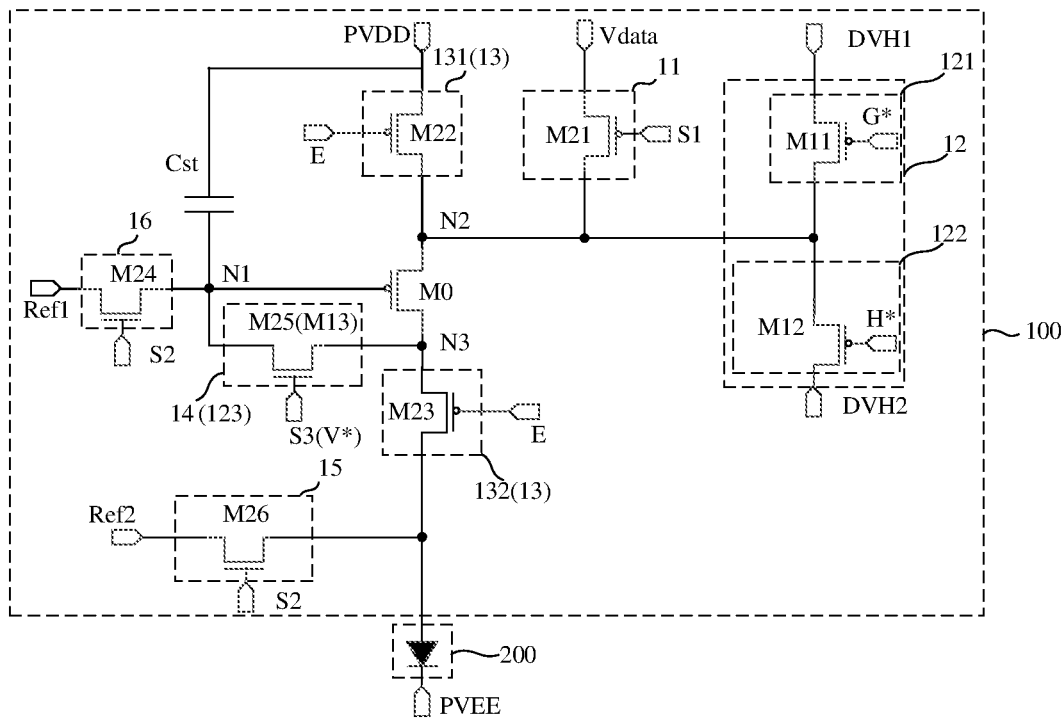
FIG. 25 is a schematic diagram of an equivalent circuit of a sub-pixel according to other embodiments of the present disclosure.

Exemplarily, as shown in FIG. 25, which is a schematic diagram of an equivalent circuit of a sub-pixel according to other embodiments of the present disclosure, the first adjusting sub-circuit 121 includes a first adjusting sub-transistor M11. A control electrode of the first adjusting sub-transistor M11 is electrically connected to the first adjusting control sub-terminal G*, a first electrode of the first adjusting sub-transistor M11 is electrically connected to the first adjusting signal terminal DVH1, and a second electrode of the first adjusting sub-transistor M11 is electrically connected to the second node N2. The second adjusting sub-circuit 122 includes a second adjusting sub-transistor M12. A control electrode of the second adjusting sub-transistor M12 is electrically connected to the second adjusting control sub-terminal H*, a first electrode of the second adjusting sub-transistor M12 is electrically connected to the second adjusting signal terminal DVH2, and a second electrode of the second adjusting sub-transistor M12 is electrically connected to the second node N2. In FIG. 25, the implementation manners of the transistors of the data writing circuit and other circuits can be the same as those in FIG. 4, which will not be repeated herein.

Exemplarily, the pixel driving circuit 100 shown in FIG. 25 can also operate according to the timing sequences shown in FIG. 14 and FIG. 16.

Exemplarily, as shown in FIG. 24, the pixel driving circuit can include a third adjusting sub-circuit 123. A first terminal of the third adjusting sub-circuit 123 is electrically connected to the first node N1, and a second terminal of the third adjusting sub-circuit 123 is electrically connected to the third node N3. The third adjusting sub-circuit 123 is configured to connect the first node N1 with the third node N3 during the first adjusting stage a'. As shown in FIG. 24, during the first adjusting stage a', when the first adjusting signal DVH1 is provided to the second node N2 through the adjusting circuit 12, the first adjusting signal DVH1 can be written to the first node N1 through the driving transistor M0 and the third adjusting sub-circuit 123 to perform potential refresh on the first node N1. With such configuration, the control electrode, the first electrode, and the second electrode of the driving transistor M0 can be refreshed during the first adjusting stage a', which is beneficial to improve the device characteristics of the driving transistor M0.

Exemplarily, as shown in FIG. 25, the third adjusting sub-circuit 123 includes a third adjusting sub-transistor M13. A control electrode of the third adjusting sub-transistor M13 is electrically connected to the third adjusting control sub-terminal V*, a first electrode of the third adjusting sub-transistor M13 is electrically connected to the third node N3, and a second electrode of the third adjusting sub-transistor M13 is electrically connected to the first node N1.

In some embodiments, as shown in FIG. 24 and FIG. 25, the threshold compensation circuit 14 can be reused as the third adjusting sub-circuit 123. In some embodiments, the fifth transistor M25 is reused as a third adjusting sub-transistor M13, so that the third scan control terminal S3 provides an enable signal during the first adjusting stage a' in addition to an enable level during the threshold compensation phase, i.e., the third scan control terminal S3 is reused as the third adjusting control sub-terminal V*. In some embodiments, it can also be understood that the third adjusting control sub-terminal V* provides an enable signal during the threshold compensation phase in addition to an enable signal during the first adjusting stage a'. That is, the pixel driving circuit 100 shown in FIG. 25 can also operate according to the timing sequence shown in FIG. 18.

Exemplarily, when the pixel driving circuit in the display panel is set according to FIG. 25, the structure of the display panel shown in FIG. 21 and the driving timing sequence of the display panel shown in FIG. 22 and FIG. 23 can still be used.

In the embodiments of the present disclosure, the display panel includes a low frequency display mode and a high frequency display mode. For example, when displaying a dynamic picture, the display panel can operate in a high-frequency display mode with a refresh frequency greater than or equal to 60 Hz, so as to improve the display effect of the display panel. When displaying a static image, the display panel can operate in a low frequency display mode with a refresh frequency ranging from 15 Hz or 30 Hz, and in this case, the power consumption of the display panel can be reduced.

In the high frequency display mode, each pixel driving circuit can repeat the data writing period T1 during operation.

In the low frequency display mode, in addition to the above data writing period, the operating period of the pixel driving circuit also includes a data retention cycle. In the data writing period T1, the pixel driving circuit can sequentially perform operations of the first adjusting stage a', the first node reset period b', the data writing stage c', the second adjusting stage d', and the light-emitting period e'. In the data retention cycle, the pixel driving circuit does not perform the operation of the data writing stage c'. For example, in some embodiments of the present disclosure, the first scan control signal S1, the second scan control signal S2, and the third scan control signal S3 can only provide the enable signal during the data writing period T1, and the light-emitting control signal E, the second sub-regulation control signal H*, and one of the regulation control signal S* and the first sub-regulation control signal G* can provide enable signals during the data write cycle T1 and the data retention cycle. During the data retention cycle, the enable signal of the regulation control signal 5*, the enable signal of the first sub-regulation control signal G*, and the enable signal of the second sub-regulation control signal H* can overlap with a disable signal of the light-emitting control signal E.

Figure 26:
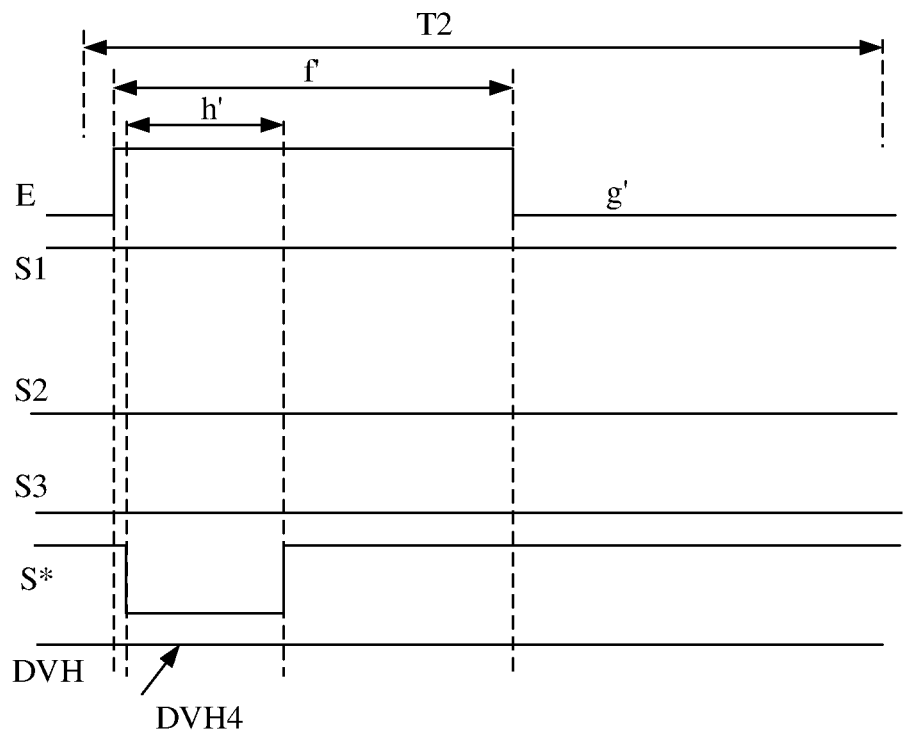
FIG. 26 is an operating timing sequence diagram of the pixel drive circuit shown in FIG. 4 during a data retention cycle according to some embodiments of the present disclosure.

FIG. 26 is an operating timing sequence diagram of the pixel drive circuit shown in FIG. 4 during a data retention cycle according to some embodiments of the present disclosure. Exemplarily, as shown in FIG. 26, a data retention cycle T2 includes a non-light-emitting period f' and a light-emitting period g'. The non-light-emitting period f' includes a third adjusting stage h'. During the third adjusting stage h', the regulation control signal terminal S* provides an enable signal, and the adjusting signal terminal DVH provides a fourth regulation signal DVH4 to control the adjusting circuit 12 to provide the second node N2 with the fourth regulation signal DVH4. The fourth regulation signal DVH4 corresponds to the data signal written by the data writing circuit during the current operating period, so that the brightness of the light-emitting element 200 during the data retention cycle is kept consistent with the data writing period.

During the non-light-emitting period f' of the data retention cycle T2, the data writing circuit 11, the light-emitting control circuit 13, the threshold compensation circuit 14, the light-emitting element reset circuit 15, and the first node reset circuit 16 are all turned off. During the light-emitting period g' of the data retention cycle T2, the light-emitting circuit 13 is turned on, and the control data writing circuit 11, the adjusting circuit 12, the threshold compensation circuit 14, the light-emitting element reset circuit 15, and the first node reset circuit 16 are all turned off.

In some embodiments, the signal provided by the adjusting signal terminal DVH can be kept constant as the fourth regulation signal DVH4 during the data retention cycle T2, so as to reduce the power consumption of the display panel. The pulse width of the enable signal provided by the adjusting control terminal S* can be adjusted according to the magnitude of the fourth regulation signal DVH4 provided by the adjusting signal terminal DVH during the data retention cycle, which is not limited in the present disclosure. For example, when the potential of the fourth regulation signal DVH4 is high, in the embodiments of the present disclosure, the pulse width of the enable signal provided by the adjusting control terminal S* can be shorter. When the potential of the fourth regulation signal DVH4 is low, the embodiments of the present disclosure, the pulse width of the enable signal provided by the adjusting control terminal S* can be longer.

As shown in FIG. 26, in some embodiments of the present disclosure, the regulation control signal S* can provide an enable signal once during the data retention cycle T2.

Figure 27:
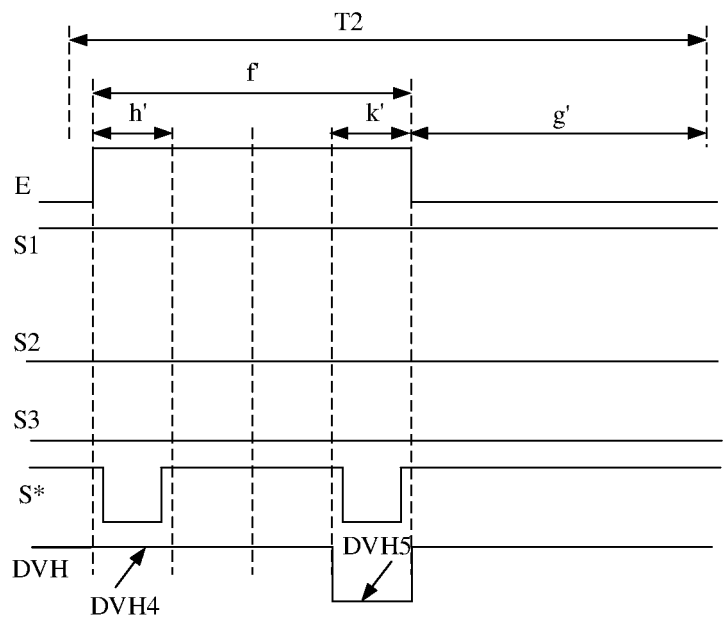
FIG. 27 is an operating timing sequence diagram of the pixel drive circuit shown in FIG. 4 during a data retention cycle according to other embodiments of the present disclosure.

As shown in FIG. 27, which is an operating timing sequence diagram of the pixel drive circuit shown in FIG. 4 during a data retention cycle according to other embodiments of the present disclosure, a fourth adjusting stage k' can be added in the non-light-emitting period f' of the data retention cycle T2, that is, the adjusting control terminal DVH provides an enable signal once in each of the third adjusting stage h' and the fourth adjusting stage k'. The fourth adjusting stage k' and the third adjusting stage h' are set at intervals.

Exemplarily, in some embodiments of the present disclosure, the duration of the third adjusting stage h' can be equal to the duration of the first adjusting stage a', the duration of the fourth adjusting stage k' can be equal to the duration of the second adjusting stage d', and a time interval between the third adjusting stage h' and the fourth adjusting stage k' is equal to a time interval between the first adjusting stage a' and the second adjusting stage d'. That is, during the data retention cycle T2, the signal timing sequence of the adjusting control terminal S* can be controlled to be the same as the timing sequence of the data writing period T1 shown in FIG. 5. As shown in FIG. 27, during the fourth adjusting stage k', the adjusting signal terminal DVH provides a fifth regulation signal DVH5 which also corresponds to the data signal written by the data writing circuit during the current operating period. With such configuration, the brightness consistency of the light-emitting element 200 during the data retention cycle T2 and the data writing period T1 can be improved, and the signals of the adjusting control terminal S* will not change complicatedly when the display panel enters the low frequency display mode.

Figure 28:
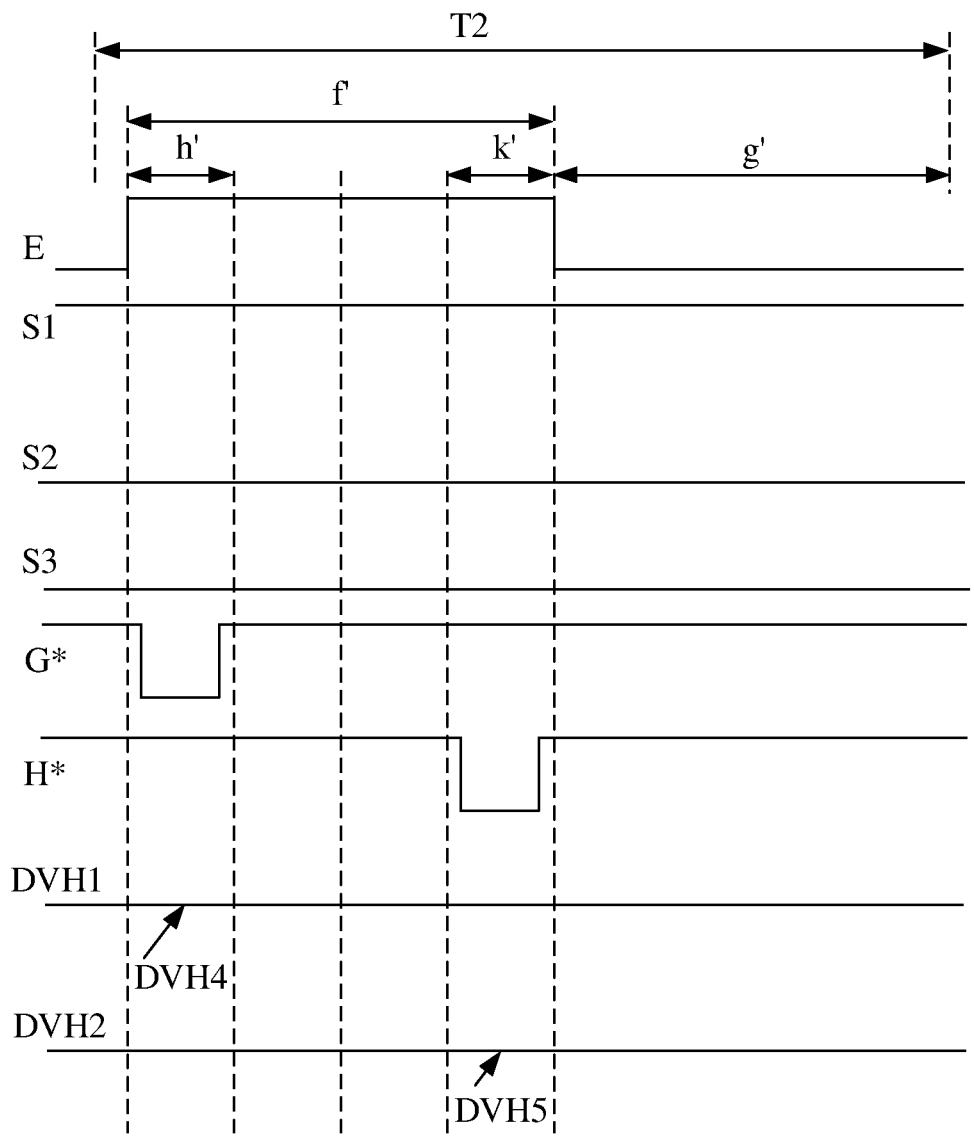
FIG. 28 is an operating timing sequence diagram of the pixel drive circuit shown in FIG. 13 and FIG. 25 during a data retention cycle according to some embodiments of the present disclosure.

FIG. 28 is an operating timing sequence diagram of the pixel drive circuit shown in FIG. 13 and FIG. 25 during a data retention cycle according to some embodiments of the present disclosure. Exemplarily, as shown in FIG. 28, providing the fourth regulation signal DVH4 to the second node N2 by the control adjusting circuit 12, includes: during the third adjusting stage h', the first adjusting sub-circuit 121 is controlled to be turned on through the first adjusting control sub-terminal G*, so that the fourth regulation signal DVH4 provided by the first adjusting signal adjusting signal terminal DVH1 is provided to the second node N2 or the third node N3 through the first adjusting sub-circuit 121. The providing the fifth regulation signal DVH5 to the second node N2 by the control adjusting circuit 12 during the fourth adjusting stage k', includes: during the fourth adjusting stage k', the second adjusting sub-circuit 122 is controlled to be turned on through the second adjusting control sub-terminal H* during the fourth adjusting stage k', so that the fifth regulation signal DVH5 provided by the second adjusting signal terminal DVH2 is provided to the second node N2 through the second adjusting sub-circuit 122.

Exemplarily, as shown in FIG. 28, during the data retention cycle T2, the signal timing sequence of the first adjusting control sub-terminal G* and the timing sequence of the second adjusting control sub-terminal H* can be controlled to be the same as those of the data writing period T1 shown in FIG. 14, so that the first adjusting control sub-terminal G* and the second adjusting control sub-terminal H* do not change complicatedly when the display panel enters the low-frequency display mode. In some embodiments, during the data retention cycle T2, the signal provided by the first adjusting signal terminal DVH1 can be kept constant as the fourth regulation signal DVH4 during the data retention cycle T2, and the signal provided by the second adjusting signal terminal DVH2 can be kept constant as the fifth regulation signal DVH5 during the data retention cycle T2, so as to reduce the power consumption of the display panel.

When the display panel is driven in the low frequency display mode, the potential of the first node N1 in the pixel driving circuit 100 can be maintained for a long time. Therefore, in the related art, in the low frequency display mode, the current leakage of the first node N1 will cause the brightness of the light-emitting element 200 to decrease, resulting in a screen shaking. In the embodiments of the present disclosure, during a data retention cycle T2, a corresponding regulation signal can be written to the second node N2 or the third node N3 through the adjusting circuit 12, which can improve the screen shaking.

Some embodiments of the present disclosure provide a method for driving a display panel. The structure of the display panel has been elaborated above, which will not be repeated herein.

A driving cycle of the pixel driving circuit includes a data writing period. The data writing period includes a first adjusting stage, a data writing stage, and a second adjusting stage. The data writing stage is between the first adjusting stage and the second adjusting stage.

As shown in FIG. 2 and FIG. 5, the method for driving the display panel provided by some embodiments of the present disclosure includes: controlling the adjusting circuit 12 to provide the first adjusting signal DVH1 to the second node N2 during the first adjusting stage a; controlling the data writing circuit 11 to provide the data signal Vdata to the second node N2 during the data writing stage c'; and controlling the adjusting circuit 12 to provide the second adjusting signal DVH2 to the second node N2 during the second adjusting stage d'.

As shown in FIG. 3 and FIG. 14, the method for driving the display panel provided by some embodiments of the present disclosure includes: controlling the adjusting circuit 12 to provide the first adjusting signal DVH1 to the third node N3 during the first adjusting stage a; controlling the data writing circuit 11 to provide the data signal Vdata to the second node N2 during the data writing stage c'; and controlling the adjusting circuit 12 to provide the second adjusting signal DVH2 to the second node N2 during the second adjusting stage d'.

In the embodiments of the present disclosure, by setting the first adjusting stage and the second adjusting stage in the data writing period of the pixel driving circuit 100, during the first adjusting stage, the first adjusting signal DVH1 is provided to the second node N2 or the third node N3 in the pixel driving circuit 100; during the second adjusting stage, the second adjusting signal DVH2 is provided to the second node N2, so that the second node N2 and/or the third node N3 can be provided with signals for during different periods, and the driving transistor M0 is in a target state at different time periods when the pixel driving circuit operates. For example, during the first adjusting stage of each frame of the display image, the first adjusting signal is wrote to the second node N2 or the third node N3 in the pixel driving circuit 100 to refresh the potential of the second node N2 or the third node N3. The voltage of the first adjusting signal can be greater than the voltage of the first power voltage terminal. When the display panel switches between different display images, this operation can eliminate the influence of the previous frame of the display image on the current frame of display image, thereby improving the hysteresis and smear of the image displayed on the display panel. During the second adjusting stage, a signal associated with the data signal of the current frame image can be wrote to the second node N2 in the pixel driving circuit 100, and the device characteristics of the driving transistor M0 during the second adjusting stage can be consistent with the device characteristics of the driving transistor M0 during the data writing stage. With such configuration, in different operating stages of the pixel driving circuit 100, fine regulation of the device characteristics of the driving transistors can be realized.

Exemplarily, in the case of controlling the adjusting circuit 12 to provide the first adjusting signal DVH to the second node N2 during the first adjusting stage a', referring to FIG. 2, FIG. 4, FIG. 5, and FIG. 6, the pixel driving circuit 100 also includes an adjusting signal terminal DVH electrically connected to the adjusting circuit 12. The adjusting signal terminal DVH provides the first adjusting signal DVH1 during the first adjusting stage a', and provides the second adjusting signal DVH2 during the second adjusting stage d'.

Exemplarily, as shown in FIG. 24 and FIG. 25, the adjusting circuit 12 includes a first adjusting sub-circuit 121 and a second adjusting sub-circuit 122. A first terminal of the first adjusting sub-circuit 121 is electrically connected to the first adjusting signal terminal DVH1, and a second terminal of the first adjusting sub-circuit 121 is electrically connected to the second node N2. A first terminal of the second adjusting sub-circuit 122 is electrically connected to the second adjusting signal terminal DVH2, and a second terminal of the second adjusting sub-circuit 122 is electrically connected to the second node N2. The controlling the adjusting circuit 12 to provide the first adjusting signal DVH1 to the second node N2 during the first adjusting stage, includes: during the first adjusting stage, controlling the first adjusting sub-circuit 121 to be turned on, so that the first adjusting signal provided by the first adjusting signal terminal DVH1 is provided to the second node N2 through the first adjusting sub-circuit 121.

The controlling the adjusting circuit 12 to provide the second adjusting signal DVH2 to the second node N2 during the second adjusting stage d', includes: during the second adjusting stage d', controlling the second adjusting sub-circuit 122 to be turned on, so that the second adjusting signal DVH2 provided by the second adjusting signal terminal DVH2 is provided to the second node N2 through the second adjusting sub-circuit 122.

Exemplarily, as shown in FIG. 3 and FIG. 13, the adjusting circuit 12 includes a first adjusting sub-circuit 121 and a second adjusting sub-circuit 122. A first terminal of the first adjusting sub-circuit 121 is electrically connected to the first adjusting signal terminal DVH1, and a second terminal of the first adjusting sub-circuit 121 is electrically connected to the third node N3. A first terminal of the second adjusting sub-circuit 122 is electrically connected to the second adjusting signal terminal DVH2, and a second terminal of the second adjusting sub-circuit 122 is electrically connected to the second node N2. The controlling the adjusting circuit 12 to provide the first adjusting signal DVH1 to the third node N3 during the first adjusting stage, includes: during the first adjusting stage, controlling the first adjusting sub-circuit 121 to be turned on, so that the first adjusting signal provided by the first adjusting signal terminal DVH1 is provided to the third node N3 through the first adjusting sub-circuit 121.

The controlling the adjusting circuit 12 to provide the second adjusting signal DVH2 to the second node N2 during the second adjusting stage d', includes: during the second adjusting stage d', controlling the second adjusting sub-circuit 122 to be turned on, so as to provide the second adjusting signal provided by the second adjusting signal terminal DVH2 to the second node N2 through the second adjusting sub-circuit 122.

Exemplarily, as shown in FIG. 4, FIG. 13 and FIG. 25, the adjusting circuit 12 can include a third adjusting sub-circuit 123. A first terminal of the third adjusting sub-circuit 123 is electrically connected to the first node N1, and a second terminal of the third adjusting sub-circuit 123 is electrically connected to the third node N3. A control electrode of the third adjusting sub-circuit 123 is electrically connected to the third adjusting control sub-terminal V*.

The method for driving the display panel can include: during the first adjusting stage a', controlling the third adjusting sub-circuit 123 to conduct the first node N1 with the third node N3, so that all three terminals of the driving transistor M0 are refreshed during the first adjusting stage, thereby improving the device characteristics of the driving transistor M0.

Referring to FIG. 17 and FIG. 18, the data writing period T1 also includes a threshold compensation phase between the first adjusting stage a' and the second adjusting stage d'. The threshold compensation phase can be performed simultaneously with the data writing stage c. The method for driving the display panel can also include: controlling the third adjusting sub-circuit 123 to conduct the first node N1 with the third node N3 during the threshold compensation phase. In some embodiments, as shown in FIG. 4, FIG. 13, and FIG. 25, with such configuration, the third adjusting control sub-terminal V* can be reused as the third scan control terminal S3, so that the third adjusting sub-circuit 123 can be reused as the threshold compensation circuit 14.

In some embodiments, a driving period of the pixel driving circuit includes a data retention cycle after the data writing period T1. The data retention cycle includes a light-emitting period and a non-light-emitting period. In the embodiments of the present disclosure, a third adjusting stage for adjusting the potential of the second node N2 or the third node N3 can be provided in the non-light-emitting period. In some embodiments, referring to FIG. 2 and FIG. 26, the method for driving the display panel includes: during the third adjusting stage h' of the data retention cycle T2, controlling the adjusting circuit 12 to provide the fourth regulation signal DVH4 to the second node N2. The fourth regulation signal DVH4 corresponds to the data signal written by the data writing circuit during the current operating period, so that the brightness of the light-emitting element 200 during the data retention cycle is kept consistent with the brightness of the light-emitting element 200 during the data writing period.

Referring to FIG. 2 and FIG. 26, the method for driving the display panel can include:
during the non-light-emitting period f' of the data retention cycle T2, controlling the control data writing circuit 11, the light-emitting control circuit 13, the threshold compensation circuit 14, the light-emitting element reset circuit 15, and the first node reset circuit 16 to be turned off; and during the light-emitting period g' of the data retention cycle T2, controlling the light-emitting circuit 13 to be turned on, and controlling the data writing circuit 11, the adjusting circuit 12, the threshold compensation circuit 14, the light-emitting element reset circuit 15, and the first node reset circuit 16 to be turned off.

That is, in the embodiments of the present disclosure, the first scan control signal S1, the second scan control signal S2, and the third scan control signal S3 can only provide the enable signal during the data writing period T1, the light-emitting control signal E can provide enable signals during both the light-emitting period of the data writing period T1 and the light-emitting period of the data retention cycle T2, and the regulation control signal S* provides the enabling signals during both the data writing period T1 and the data retention cycle T2.

In some embodiments, the signal provided by the adjusting signal terminal DVH can be kept constant as the fourth regulation signal DVH4 during the data retention cycle T2, so as to reduce the power consumption of the display panel. The pulse width of the enable signal provided by the adjusting control terminal S* can be adjusted according to the magnitude of the fourth regulation signal DVH4 provided by the adjusting signal terminal DVH during the data retention cycle, which is not limited in the present disclosure. For example, when the potential of the fourth regulation signal DVH4 is high, the pulse width of the enable signal provided by the adjusting control terminal S* can be shorter. When the potential of the fourth regulation signal DVH4 is low, the pulse width of the enable signal provided by the adjusting control terminal S* can be longer.

As shown in FIG. 26, in some embodiments of the present disclosure, the regulation control signal S* can provide an enable signal once during the data retention cycle T2.

As shown in FIG. 27, in some embodiments of the present disclosure, a fourth adjusting stage k' can be added in the non-light-emitting period f' of the data retention cycle T2, that is, the adjusting control terminal DVH is configured to provide an enable signal once during the third adjusting stage h' and the fourth adjusting stage k'. The fourth adjusting stage k' and the third adjusting stage h' are set at intervals. As shown in FIG. 27, during the fourth adjusting stage k', the adjusting signal terminal DVH provides the fifth regulation signal DVH5, which corresponds to the data signal written by the data writing circuit during the current operating period. The fifth regulation signal DVH5 can be equal or unequal to the fourth regulation signal DVH4.

Exemplarily, in some embodiments of the present disclosure, the duration of the third adjusting stage h' is equal to the duration of the first adjusting stage a', the duration of the fourth adjusting stage k' is equal to the duration of the second adjusting stage d', and the time interval between the third adjusting stage h' and the fourth adjusting stage k' is equal to the time interval between the first adjusting stage a' and the second adjusting stage d'. In this way, the signal of the adjusting control terminal S* can be kept consistent during the data writing period T1 and the data retention cycle T2, and the complexity of the signal of the adjusting control terminal S* can be reduced.

In some embodiments, when the pixel driving circuit is designed to have the structures shown in FIG. 24 and FIG. 25, as shown in FIG. 28, controlling the adjusting circuit 12 to provide the fourth regulation signal DVH4 to the second node N2 during the third adjusting stage h', includes: during the third adjusting stage h', controlling the first adjusting sub-circuit 121 to be turned on through the first adjusting control sub-terminal G*, so that the fourth regulation signal DVH4 provided by the first adjusting signal terminal DVH1 is provided to the second node N2 through the first sub-adjusting circuit 121. The controlling the control adjusting circuit 12 to provide the fifth regulation signal DVH5 to the second node N2 during the fourth adjusting stage k', includes: during the fourth adjusting stage k', controlling the second adjusting sub-circuit 122 to be turned on by the second adjusting control sub-terminal H*, so that the fifth regulation signal DVH5 provided by the second adjusting signal terminal DVH2 is provided to the second node N2 through the second adjusting sub-circuit 122.

In some embodiments, during the data retention cycle T2, the signal of the first adjusting control sub-terminal G* and the signal of the second adjusting control sub-terminal H* can have the same time sequence as the data writing period T1 shown in FIG. 14, so that the first adjusting control sub-terminal G*, the second adjusting control sub-terminal H* and the light-emitting control signal terminal E do not change complicatedly when the display panel enters the low-frequency display mode. In this case, the first adjusting signal terminal DVH1 and the second adjusting signal terminal DVH2 can both provide constant signals during the data retention cycle T2, so as to reduce the power consumption of the display panel.

Figure 29:
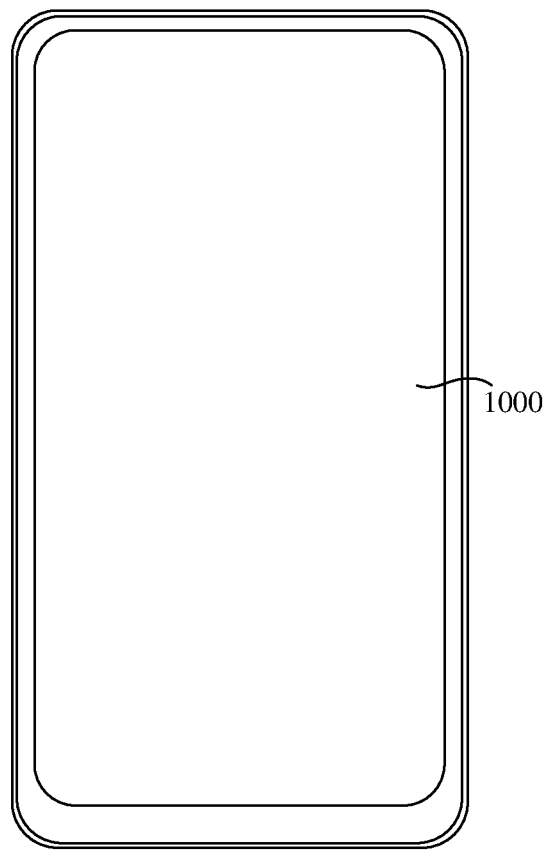
FIG. 29 is a schematic diagram of a display apparatus according to some embodiments of the present disclosure.

Some embodiments of the present disclosure provides a display apparatus. As shown in FIG. 29, FIG. 29 is a schematic diagram of a display apparatus according to some embodiments of the present disclosure, the display apparatus includes a display panel 1000 mentioned above. The structure of the display panel 1000 has been elaborated in the above-mentioned embodiments, and will not be repeated herein. The display apparatus shown in FIG. 29 is only a schematic illustration, and the display apparatus can be any electronic device with a display function, such as a mobile phone, a tablet computer, a laptop computer, an electronic paper book, or a television.

The above are merely some embodiments of the present disclosure, which does not limit the present disclosure. Whatever within the principles of the present disclosure, including any modification, equivalent substitution, improvement, etc., shall fall within the scope of the present disclosure.

What is claimed is:

1. A display panel, comprising:
light-emitting elements; and
pixel driving circuits, wherein at least one of the pixel driving circuits comprises a driving transistor, a data writing circuit, and an adjusting circuit, wherein the driving transistor comprises a gate electrically connected to a first node, a first electrode electrically connected to a second node, and a second electrode electrically connected to a third node, wherein the third node is electrically connected to one of the light-emitting elements;
wherein each of at least one operating period of each of the pixel driving circuits comprises a data writing period, wherein the data writing period comprises a first adjusting stage, a second adjusting stage, and a data writing stage between the first adjusting stage and the second adjusting stage;
wherein the data writing circuit is configured to provide a data signal to the second node during the data writing stage; and
wherein the adjusting circuit is configured to provide a first adjusting signal to the second node during the first adjusting stage, and to provide a second adjusting signal to the second node during the second adjusting stage, wherein a voltage of the first adjusting signal is greater than a voltage of the second adjusting signal.

2. The display panel according to claim 1, wherein the adjusting circuit comprises a first terminal electrically connected to the second node, and a second terminal electrically connected to one adjusting signal terminal of adjusting signal terminals, and wherein the adjusting circuit is configured to provide a signal of the one adjusting signal terminal to the second node in response to a signal of an adjusting control terminal;
the adjusting control terminal is configured to provide a signal for turning on the adjusting circuit during each of the first adjusting stage and the second adjusting stage; and
the one adjusting signal terminal is configured to provide the first adjusting signal during the first adjusting stage and provide the second adjusting signal during the second adjusting stage.

3. The display panel according to claim 2, further comprising:
M pixel driving circuit row groups, wherein each of the M pixel driving circuit row groups comprises N pixel driving circuit rows, each of the N pixel driving circuit rows comprises at least two of the pixel driving circuits; and
M adjusting control circuits that are cascaded, wherein at least two of the adjusting control terminals in one of the M pixel driving circuit row groups are electrically connected to one of the M adjusting control circuits, where M is an integer greater than or equal to 2 and N is an integer greater than or equal to 1;
wherein the M adjusting control circuits successively output a first pulse and a second pulse in a scanning sequence of the display panel, and the first adjusting stage of one pixel driving circuit of the pixel driving circuits that is electrically connected to one adjusting control circuit of the M adjusting control circuits corresponds to the first pulse, and the second adjusting stage of the one pixel driving circuit that is electrically connected to the one adjusting control circuit corresponds to the second pulse; and
wherein the second pulse output by an $i^{th}$ adjusting control circuit of the M adjusting control circuits overlaps with the first pulse output by a $j^{th}$ adjusting control circuit of the M adjusting control circuits, where i and j are integers, and $1 \leq i < j \leq M$.

4. The display panel according to claim 3, further comprising:
at least one first adjusting signal line, wherein one first adjusting signal line of the at least one first adjusting signal line is electrically connected to the adjusting circuit of one of the M pixel drive circuit row groups that is electrically connected to the $i^{th}$ adjusting control circuit; the one first adjusting signal line is configured to transmit the first adjusting signal when the $i^{th}$ adjusting control circuit outputs the first pulse; and the one first adjusting signal line is configured to transmit the second adjusting signal when the $i^{th}$ adjusting control circuit outputs the second pulse; and
at least one second adjusting signal line, wherein one second adjusting signal line of the at least one second adjusting signal line is electrically connected to the adjusting circuit of one of the M pixel drive circuit row groups that is electrically connected to the $j^{th}$ adjusting control circuit; the one second adjusting signal line is configured to transmit the first adjusting signal when the $j^{th}$ adjusting control circuit outputs the first pulse;

and the one second adjusting signal line is configured to transmit the second adjusting signal when the $j^{th}$ adjusting control circuit outputs the second pulse.

5. The display panel according to claim 4, wherein the M adjusting control circuits that are cascaded comprise at least two adjusting control circuit groups, and one of the at least two adjusting control circuit groups comprises (j−i) adjacent adjusting control circuits of the M adjusting control circuits;

the M pixel driving circuit row groups comprise at least two pixel driving circuit row group units, and each of the at least two pixel driving circuit row group units comprises (j−i) adjacent pixel driving circuit row groups of the M pixel driving circuit row groups; and in the scanning sequence of the display panel, at least two of the pixel driving circuits in an odd-numbered pixel driving circuit row group of the M pixel driving circuit row groups are electrically connected to one of the at least one first adjusting signal line, and at least two of the pixel driving circuits in an even-numbered pixel driving circuit row group of the M pixel driving circuit row groups are electrically connected to one of the at least one second adjusting signal line.

6. The display panel according to claim 3, wherein N≥2; the first adjusting stage is longer than the data writing stage; and
the second adjusting stage is longer than the data writing stage.

7. The display panel according to claim 1, wherein the adjusting circuit comprises a first adjusting sub-circuit and a second adjusting sub-circuit, the first adjusting sub-circuit is electrically connected to the second node, and the second adjusting sub-circuit is electrically connected to the second node;

the first adjusting sub-circuit is configured to provide the first adjusting signal to the second node during the first adjusting stage;

the second adjusting sub-circuit is configured to provide the second adjusting signal to the second node during the second adjusting stage;

the first adjusting sub-circuit comprises a first adjusting sub-transistor, wherein the first adjusting sub-transistor comprises a control electrode electrically connected to a first adjusting control sub-terminal, a first electrode electrically connected to a first adjusting signal terminal, and a second electrode electrically connected to the second node; the first adjusting control sub-terminal is configured to provide a signal to turn on the first adjusting sub-transistor during the first adjusting stage; and the first adjusting signal terminal is configured to provide the first adjusting signal during the first adjusting stage; and the second adjusting sub-circuit comprises a second adjusting sub-transistor, wherein the second adjusting sub-transistor comprises a control electrode electrically connected to a second adjusting control sub-terminal, a first electrode electrically connected to a second adjusting signal terminal, and a second electrode electrically connected to the second node; the second adjusting control sub-terminal is configured to provide a signal to turn on the second adjusting sub-transistor during the second adjusting stage; and the second adjusting signal terminal is configured to provide the second adjusting signal during the second adjusting stage.

8. The display panel according to claim 7, wherein at least one of the first adjusting signal terminal or the second adjusting signal terminal is configured to provide a constant signal.

9. The display panel according to claim 7, wherein the adjusting circuit further comprises a third adjusting sub-circuit, wherein the third adjusting sub-circuit comprises a first terminal electrically connected to the first node, and a second terminal electrically connected to the third node; and
the third adjusting sub-circuit is configured to connect the first node with the third node during the first adjusting stage.

10. The display panel according to claim 7, wherein the data writing period further comprises a threshold compensation phase between the first adjusting stage and the second adjusting stage;

the adjusting circuit further comprises a third adjusting sub-circuit, wherein the third adjusting sub-circuit comprises a first terminal electrically connected to the first node, and a second terminal electrically connected to the third node; and the third adjusting sub-circuit is further configured to compensate a threshold voltage of the driving transistor during the threshold compensation phase.

11. The display panel according to claim 10, wherein the third adjusting sub-circuit comprises a third adjusting sub-transistor, wherein the third adjusting sub-transistor comprises a control electrode electrically connected to a third adjusting control sub-terminal, a first electrode electrically connected to the third node, and a second electrode electrically connected to the first node; and the third adjusting control sub-terminal is configured to provide a signal for turning on the third adjusting sub-transistor during each of the first adjusting stage and the threshold compensation phase.

12. The display panel according to claim 1, wherein the at least one operating period comprises a plurality of operating periods, and the plurality of operating periods has a same first adjusting signal, and wherein the at least one operating period comprises a plurality of operating periods, and the second adjusting signal corresponds to a data signal written by the data writing circuit during a current operating period of the plurality of operating periods.

13. The display panel according to claim 12, wherein the second node is electrically connected to a first power voltage terminal, one of the light-emitting elements is electrically connected to a second power voltage terminal, the first power voltage terminal has a voltage greater than a voltage of the second power voltage terminal, and the first adjusting signal has a voltage greater than or equal to the voltage of the first power voltage terminal.

14. A display apparatus, comprising the display panel according to claim 1.

15. A method for driving a display panel, wherein the display panel comprises light-emitting elements and pixel driving circuits electrically connected to the light-emitting elements, wherein each of the pixel driving circuits comprises a driving transistor, a data writing circuit, and an adjusting circuit; the driving transistor comprises a gate electrically connected to a first node, a first electrode electrically connected to a second node, and a second electrode electrically connected to a third node; and wherein each of at least one operating period of each of the pixel driving circuits comprises a data writing period, wherein the data writing period comprises a first adjusting stage, a second adjusting stage, and a data writing stage between the first adjusting stage and the second adjusting stage; and wherein the method comprises:
controlling the adjusting circuit to provide a first adjusting signal to the second node during the first adjusting stage;
controlling the data writing circuit to provide a data signal to the second node during the data writing stage; and
controlling the adjusting circuit to provide a second adjusting signal to the second node during the second adjusting stage,
wherein a voltage of the first adjusting signal is greater than a voltage of the second adjusting signal.

16. The method according to claim 15, wherein during the first adjusting stage, the adjusting circuit is controlled to provide the first adjusting signal to the second node; and the pixel driving circuit further comprises an adjusting signal terminal electrically connected to the adjusting circuit, and the adjusting signal terminal is configured to provide the first adjusting signal during the first adjusting stage, and to provide the second adjusting signal during the second adjusting stage; or
wherein the adjusting circuit comprises a first adjusting sub-circuit and a second adjusting sub-circuit, the first adjusting sub-circuit is electrically connected to the second node, and the second adjusting sub-circuit is electrically connected to the second node; wherein said controlling the adjusting circuit to provide the first adjusting signal to the second node during the first adjusting stage comprises: controlling the first adjusting sub-circuit to provide the first adjusting signal to the second node during the first adjusting stage; and wherein said controlling the adjusting circuit to provide the second adjusting signal to the second node during the second adjusting stage, comprises: controlling the second adjusting sub-circuit to provide the second adjusting signal to the second node during the second adjusting stage.

17. The method according to claim 15, wherein the adjusting circuit further comprises a third adjusting sub-circuit, wherein the third adjusting sub-circuit comprises a first terminal electrically connected to the first node, and a second terminal electrically connected to the third node;
wherein the method further comprises:
controlling the third adjusting sub-circuit to connect the first node with the third node during the first adjusting stage;
wherein the data writing period further comprises a threshold compensation phase between the first adjusting stage and the second adjusting stage; and
wherein the method further comprises:
controlling the third adjusting sub-circuit to connect the first node with the third node during the threshold compensation phase.

18. A display panel, comprising:
a data line;
a light-emitting element; and
a pixel driving circuit comprising: a driving transistor, a first light-emitting control transistor, a second light-emitting control transistor, a first transistor, a first adjusting transistor, and a second adjusting transistor,
wherein the driving transistor comprises: a gate electrically connected to a first node, a first electrode electrically connected to a second node, and a second electrode electrically connected to a third node,
wherein the first light-emitting control transistor is connected between a first power voltage terminal and the second node, the second light-emitting control transistor is connected between the third node and a first electrode of the light-emitting element, a second electrode of the light-emitting element is electrically connected to a second power voltage terminal, the data line is connected to the second node through the first transistor, a first adjusting signal terminal is connected to the third node through the first adjusting transistor, and a second adjusting signal terminal is connected to the second node through the second adjusting transistor,
wherein the first power voltage terminal provides a first power voltage, the second power voltage terminal provides a second power voltage, the first power voltage is greater than the second power voltage, the first adjusting signal terminal provides a first adjusting voltage, the second adjusting signal terminal provides a second adjusting voltage, the first adjusting voltage is greater than or equal to the first power voltage, and the first adjusting voltage is greater than the second adjusting voltage,
wherein a plurality of operating periods of the pixel driving circuit each comprise a first adjusting stage, a data writing stage, a second adjusting stage, and a light-emitting stage, and the data writing stage is between the first adjusting stage and the second adjusting stage,
wherein in the first adjusting stage, the first transistor and the second adjusting transistor are turned off, and the first adjusting transistor is turned on and transmits the first adjusting voltage to the third node,
in the data writing stage, the first adjusting transistor and the second adjusting transistor are turned off, and the first transistor is turned on and transmits a data signal to the second node, and
in the second adjusting stage, the first transistor and the first adjusting transistor is turned off, and the second adjusting transistor is turned on and transmits the second adjusting voltage to the second node.

19. The display panel according to claim 18, wherein the first adjusting voltage is constant in the plurality of operating periods, and the second adjusting voltage in each of the plurality of operating periods is determined by the data signal in each of the plurality of operating periods.

20. The display panel according to claim 18, wherein the pixel driving circuit further comprises: a first reset transistor connected between the gate of the driving transistor and a first reset signal terminal, and a second reset transistor connected between the first electrode of the light-emitting element and a second reset signal terminal,
wherein each of the plurality of operating periods comprises a reset stage between the first adjusting stage and the data writing stage, wherein in the reset stage, the first transistor, the first adjusting transistor and the second adjusting transistor are turned off, the first reset transistor and the second reset transistor are turned on, the first reset transistor transmits a first reset voltage provided by the first reset signal terminal to the gate of the driving transistor, and the second reset transistor transmits a second reset voltage provided by the second reset signal terminal to the first electrode of the light-emitting element.

* * * * *